United States Patent
LeCloux et al.

(10) Patent No.: US 7,670,506 B1
(45) Date of Patent: Mar. 2, 2010

(54) PHOTOACTIVE COMPOSITIONS FOR LIQUID DEPOSITION

(75) Inventors: Daniel David LeCloux, Wilmington, DE (US); Eric M. Smith, Hockessin, DE (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 911 days.

(21) Appl. No.: 11/321,784

(22) Filed: Dec. 29, 2005

Related U.S. Application Data

(60) Provisional application No. 60/640,489, filed on Dec. 30, 2004, provisional application No. 60/694,885, filed on Jun. 28, 2005.

(51) Int. Cl.
- C09K 11/06 (2006.01)
- C09K 11/07 (2006.01)
- H01J 1/02 (2006.01)
- H01J 63/00 (2006.01)

(52) U.S. Cl. .......... 252/301.21; 252/301.16; 252/301.17; 252/301.33; 252/700; 252/582; 313/504; 313/503; 438/29; 438/542

(58) Field of Classification Search ......... 252/301.16, 252/301.17; 313/504
See application file for complete search history.

(56) References Cited

U.S. PATENT DOCUMENTS

| | | | |
|---|---|---|---|
| 4,552,927 A | 11/1985 | Warren | 525/279 |
| 4,869,979 A | 9/1989 | Ohtani et al. | 429/213 |
| 4,889,659 A | 12/1989 | Genies | 252/500 |
| 4,933,106 A | 6/1990 | Sakei et al. | 252/500 |
| 4,959,430 A | 9/1990 | Jonas et al. | 526/257 |
| 4,973,391 A | 11/1990 | Madou et al. | 204/78 |
| 5,002,700 A | 3/1991 | Otagawa et al. | 252/500 |
| 5,057,687 A * | 10/1991 | Leyshon et al. | 250/239 |
| 5,069,820 A | 12/1991 | Jen et al. | 252/500 |
| 5,160,457 A | 11/1992 | Elsenbaumer | 252/500 |
| 5,185,100 A | 2/1993 | Han et al. | 252/500 |
| 5,247,190 A | 9/1993 | Friend et al. | 257/40 |
| 5,258,461 A | 11/1993 | Facci et al. | 525/165 |
| 5,286,413 A | 2/1994 | Hannecart et al. | 252/500 |
| 5,294,504 A | 3/1994 | Otagawa et al. | 429/213 |
| 5,300,575 A | 4/1994 | Jonas et al. | 525/186 |
| 5,317,169 A | 5/1994 | Nakano et al. | 257/40 |

(Continued)

FOREIGN PATENT DOCUMENTS

EP 0 593 111 A1 4/1994

(Continued)

OTHER PUBLICATIONS

Campbell, I.H. et al., "Excitation Transfer Processes in a Phosphor-Doped (p-phenylene vinylene) Light-Emitting Diode", *Physical Review. B.*, 2002, vol. 65, Issue 8, 085210-1-085210-8.

(Continued)

Primary Examiner—Joseph D Anthony
(74) Attorney, Agent, or Firm—Woodcock Washburn LLP

(57) ABSTRACT

Compositions are provided, comprising a host and a dopant, wherein the weight:weight ratio of host:dopant is about 10:1 to about 40:1, and a solvent, and methods for making the same, as well as devices and sub-assemblies including the same.

25 Claims, 1 Drawing Sheet

U.S. PATENT DOCUMENTS

| | | | | |
|---|---|---|---|---|
| 5,378,402 | A | 1/1995 | Cross et al. | 252/500 |
| 5,537,000 | A | 7/1996 | Alivisatos et al. | 313/506 |
| 5,554,179 | A | 9/1996 | Stroetmann et al. | 607/129 |
| 5,578,249 | A | 11/1996 | Ohtani et al. | 252/519 |
| 5,705,888 | A | 1/1998 | Staring et al. | 313/503 |
| 5,716,550 | A | 2/1998 | Gardner et al. | 252/500 |
| 5,728,801 | A | 3/1998 | Wu et al. | 528/422 |
| 5,929,194 | A | 7/1999 | Woo et al. | 528/229 |
| 5,948,552 | A | 9/1999 | Antoniadis et al. | 428/690 |
| 5,986,400 | A | 11/1999 | Staring et al. | 313/503 |
| 5,994,496 | A | 11/1999 | Van Haare et al. | 528/376 |
| 6,083,635 | A | 7/2000 | Jonas et al. | 428/690 |
| 6,205,016 | B1 | 3/2001 | Niu | 361/503 |
| 6,303,238 | B1 | 10/2001 | Thompson et al. | 428/690 |
| 6,340,496 | B1 | 1/2002 | Cloots et al. | 427/58 |
| 6,391,481 | B1 | 5/2002 | Jonas et al. | 428/690 |
| 6,538,374 | B2* | 3/2003 | Hosokawa | 313/504 |
| 6,541,129 | B1* | 4/2003 | Kawamura et al. | 428/690 |
| 6,563,262 | B1* | 5/2003 | Cao | 313/506 |
| 6,611,096 | B1 | 8/2003 | McCormick et al. | 313/506 |
| 6,844,670 | B2* | 1/2005 | Kuma et al. | 313/501 |
| 6,946,319 | B2* | 9/2005 | Stegamat et al. | 438/104 |
| 2001/0019782 | A1 | 9/2001 | Igarashi et al. | 428/690 |
| 2002/0038999 | A1 | 4/2002 | Cao et al. | 313/503 |
| 2002/0041151 | A1 | 4/2002 | Park et al. | 313/504 |
| 2004/0007971 | A1* | 1/2004 | Higashi et al. | 313/504 |
| 2004/0010115 | A1 | 1/2004 | Sotzing | 528/377 |
| 2004/0072987 | A1 | 4/2004 | Groenendaal et al. | 528/377 |
| 2004/0102577 | A1 | 5/2004 | Hsu et al. | 525/182 |
| 2004/0127637 | A1 | 7/2004 | Hsu et al. | 524/800 |
| 2004/0222413 | A1 | 11/2004 | Hsu et al. | 257/40 |
| 2004/0254297 | A1 | 12/2004 | Hsu et al. | 525/54.2 |
| 2005/0014017 | A1* | 1/2005 | Hosokawa et al. | 428/690 |
| 2005/0048314 | A1* | 3/2005 | Antoniadis et al. | 428/690 |
| 2005/0222333 | A1 | 10/2005 | Hsu | 525/178 |
| 2006/0055305 | A1* | 3/2006 | Funahashi et al. | 313/376 |
| 2006/0257687 | A1* | 11/2006 | Hosokawa et al. | 428/690 |
| 2008/0160344 | A1* | 7/2008 | Hosokawa et al. | 428/690 |

FOREIGN PATENT DOCUMENTS

| | | |
|---|---|---|
| EP | 0 440 957 B1 | 3/1996 |
| EP | 0 817 540 A2 | 6/1997 |
| EP | 0 962 943 A1 | 12/1999 |
| EP | 1 191 612 A2 | 3/2002 |
| EP | 1 191 614 A2 | 3/2002 |
| EP | 1 231 251 A1 | 8/2002 |
| FR | 2 632 979 A1 | 12/1989 |
| GB | 2 124 635 | 2/1984 |
| JP | 2-160823 | 6/1990 |
| WO | WO 99/34371 A1 | 7/1999 |
| WO | WO 00/70655 | 11/2000 |
| WO | WO 01/38219 A1 | 5/2001 |
| WO | WO 01/41512 A1 | 6/2001 |
| WO | WO 02/02714 A2 | 1/2002 |
| WO | WO 02/15645 A1 | 2/2002 |
| WO | WO 02/065484 A1 | 8/2002 |
| WO | WO 03/037836 A1 | 5/2003 |
| WO | WO 2004/018588 A1 | 3/2004 |

OTHER PUBLICATIONS

Gao, J. et al., Soluble Polypyyrole as the Transparent Anode in Polymer Light-Emitting Diodes, *Synthetic Metals*, 1996, 82, 221-223.

Gustafsson, G. et al., Flexible Light-Emitting Diodes made from Soluble Conducting Polymer, *Nature*, 1992, 357, 477-479.

Hsu, C.H., Novel Preparation and Properties of Conductive Polyaniine/Nafon® Film, *Synthetic Metals*, 1991, 671-674.

Lefebvre, ark, et al., Characterization and Electrochemical Studies of Poly(3,4-ethylenedioxythiophene)Poly(styrene-4-sulfonate) Composites, *Chemical Material*, 1999, 11, 262-268.

O'Brien, D.F., et al., "Electrophosphoresense from a Doped Polymer Light Emitting Diode", *Synthetic Metals*, 2001, 116, (1-3), 379-383.

Othmer, K., *Encyclopedia of Chemical Technology*, 1996, $4^{th}$ edition, 18, 837-860.

Pickup P. G. et al., "Electronically Conducting Cation-Exchanger Polymer Powders: Synthesis Characterization and Application in PEM Feul Cells and Supercapacitors", *Journal of New Materials for Electrochemical Systems*, 2000, 3, 21-26.

Sharpe, A.J. et al., Improved Caitonic Conductive Polymer, Calgon Corp, Coating Conference, Proceedings of the Technical Association of the Pulp and Paper Industry, 1981, 83-87.

Zhigang, Q. et al., Size Control of Polypyrrole Particles, *Chemical Materials*, 1997, 9, 2934-2939.

Colvin, V.L. et al., "Light-Emitting Diodes made from Cadmium Selenide Nanocrystals and a Semiconducting Polymer", *Nature*, 1994, 370, 354-357.

Levi, O. et al., "Polymer and Cathode Emission Studies of Polymer-Based Light-Emitting Diodes under Strong Electrical Pulse Excitation", *Journal of Applied Physics*, 2000, 88(5), 2548-2552.

Thelakkat, M. et al., "Poly(triarylamine)s-Synthesis and Application in Electroluminescent Devices and Photovoltaics", *Synthetic Metals*, 1999, 102, 1125-1128.

\* cited by examiner

PHOTOACTIVE COMPOSITIONS FOR LIQUID DEPOSITION

CROSS REFERENCE

This application claims benefit to U.S. Provisional Application Ser. Nos. 60/640,489, filed Dec. 30, 2004 and 60/694,885, filed Jun. 28, 2005, the disclosures of which are each incorporated herein by reference in their entireties.

REQUEST FOR NONPUBLICATION

This application is not to be published under 35 U.S.C. 122(b), as per the attached Nonpublication Request pursuant to 37 CFR §1.213.

FIELD

This disclosure relates generally to photoactive compositions, for example, those found in organic electronic devices, and materials and methods for fabrication of the same.

BACKGROUND

Organic electronic devices convert electrical energy into radiation, detect signals through electronic processes, convert radiation into electrical energy, or include one or more organic semiconductor layers. Organic electronic devices include at least one active layer comprising photoactive compositions. These photoactive compositions are, therefore, very important to the industry.

Thus, what is needed are photoactive compositions, methods for making the same, as well as devices and sub-assemblies including the same.

SUMMARY

In one embodiment, compositions are provided, comprising a host, for example, a distyrylarylene, a diarylanthracene, or mixtures thereof, and a dopant, for example, an arylamine, wherein the weight:weight ratio of host:dopant is about 10:1 to about 40:1, and a solvent, and methods for making the same, as well as devices and sub-assemblies including the same.

The foregoing general description and the following detailed description are exemplary and explanatory only and are not restrictive of the invention, as defined in the appended claims.

BRIEF DESCRIPTION OF THE DRAWINGS

Embodiments are illustrated in the accompanying figures to improve understanding of concepts as presented herein.

Figure 1:
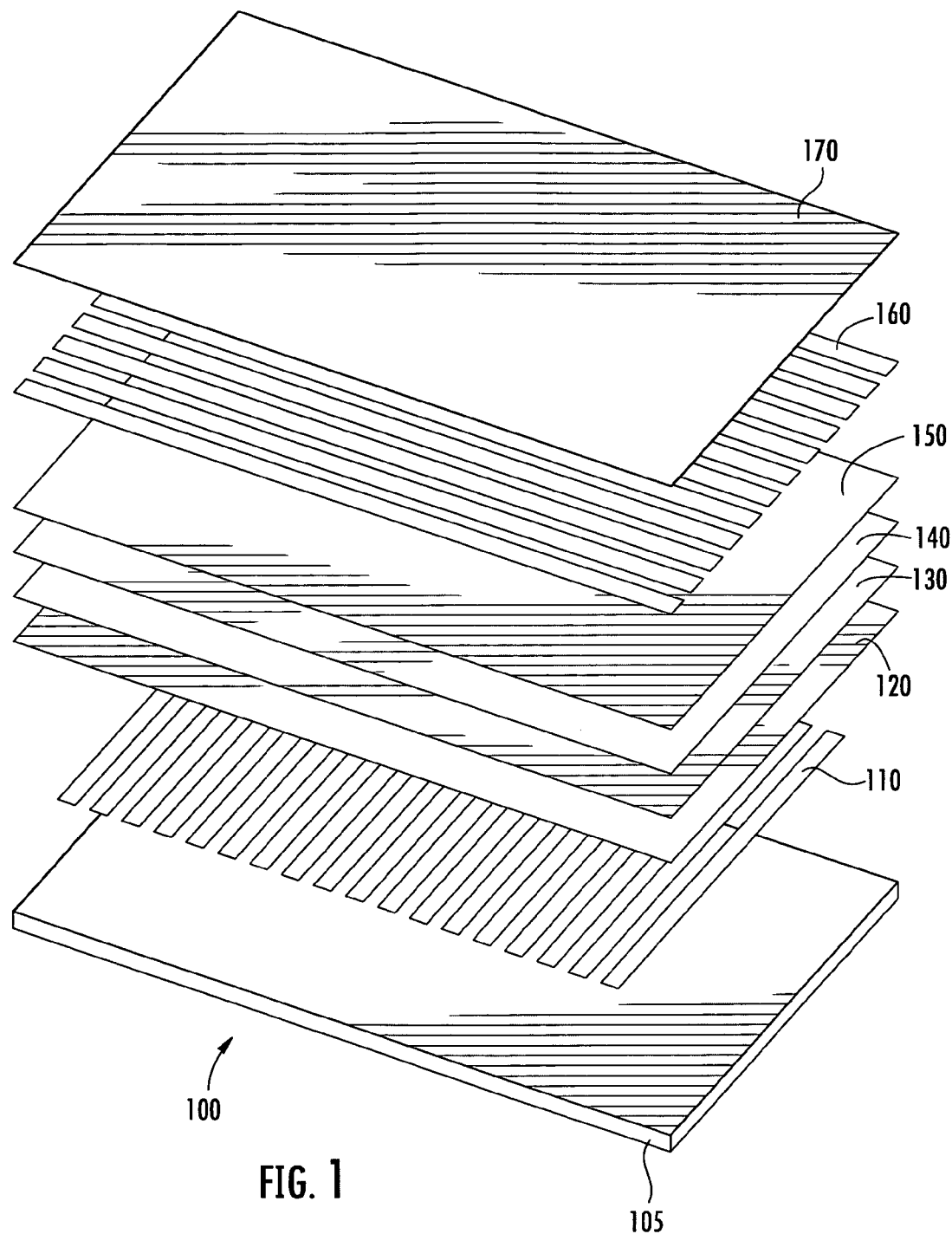
FIG. 1 is a schematic diagram of an organic electronic device.

The figures are provided by way of example and are not intended to limit the invention. Skilled artisans appreciate that objects in the figures are illustrated for simplicity and clarity and have not necessarily been drawn to scale. For example, the dimensions of some of the objects in the figures may be exaggerated relative to other objects to help to improve understanding of embodiments.

DETAILED DESCRIPTION

In one embodiment, compositions are provided comprising a host and a dopant, wherein the weight:weight ratio of host:dopant is about 10:1 to about 40:1; and a solvent. In one embodiment, the host and dopant are present in a concentration of about 1.0% w/v in the solvent when the solvent includes toluene. It is understood that this w/v range will be solvent dependent and process dependent. Thus, if higher boiling solvents are used, or if certain printing processes are used, the weight/volume ratio will have to be adjusted in a routine manner.

In one embodiment, compositions are provided comprising (i) a distyrylarylene, a diarylanthracene, or mixtures thereof, and (ii) an arylamine, in a concentration of about 1.0% w/v in an organic solvent. In one embodiment, the weight:weight ratio of (i):(ii) is about 10:1 to about 40:1. In one embodiment, the weight:weight ratio is 13:1.

Solvents

In one embodiment, the solvent is an aromatic hydrocarbon. In one embodiment, the solvent is an aprotic organic solvent, which may be toluene, xylene, mesitylene, anisole, chlorobenzene, cyclohexanone, gamma-valerolactone, chloroform, tetrachloroethane, tetrachloroethylene, trifluorotoluene, methylbenzoate, N,N-dimethylformamide or derivatives thereof, and mixtures thereof. In one embodiment, the solvent is toluene. In one embodiment, the solvent is trifluorotoluene. In one embodiment, the solvent is a mixture of toluene and trifluorotoluene. In one embodiment, the solvent need not be aprotic, and may further include esters, ketones, and alcohols to adjust the solubility and drying times of the composition as may be desired in view of the deposition technique in making an organic electronic device.

Hosts

The distyrylarylenes are commonly referred to as host compounds in the art of light emitting layer fabrication. In one embodiment, the host compounds are diarylanthracene.

In one embodiment, the host compounds are of Formulae 1 or 2:

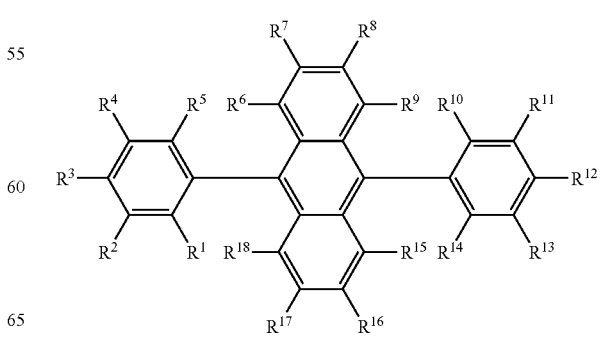

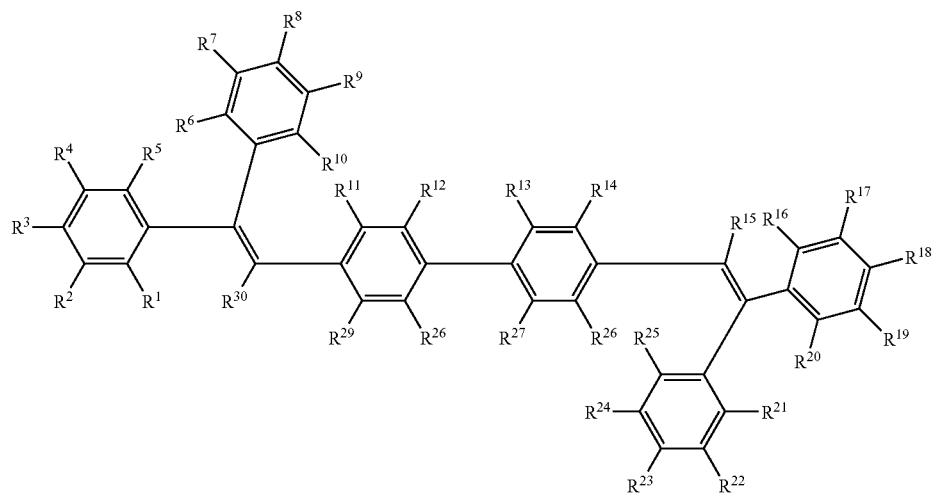
wherein $R^1$ to $R^{30}$ are, independently, hydrogen, alkyl, alkoxy, or aryl.
In one embodiment, the compounds are of Formulae 3-9:
3
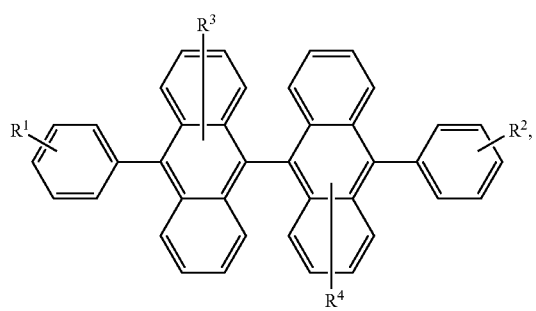
4
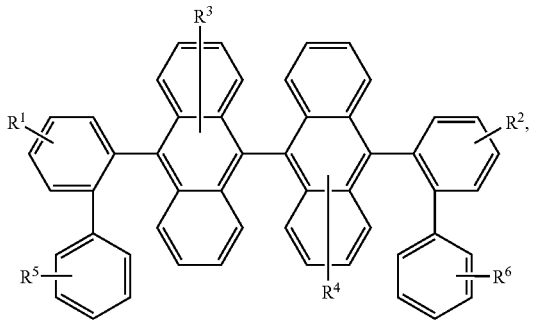
5
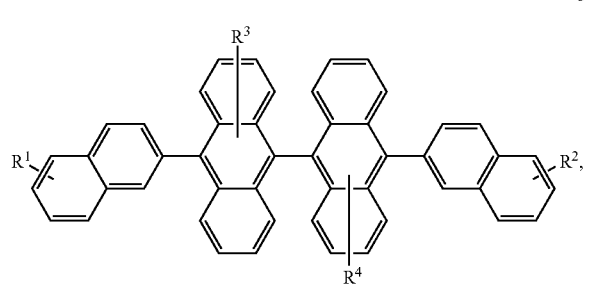
-continued
6
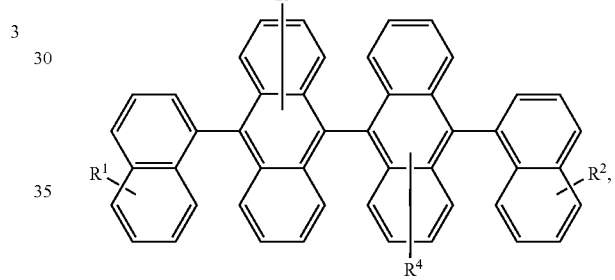
7
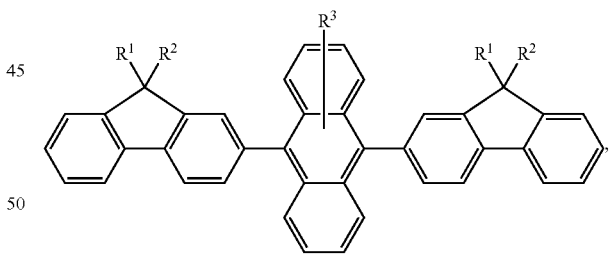
8
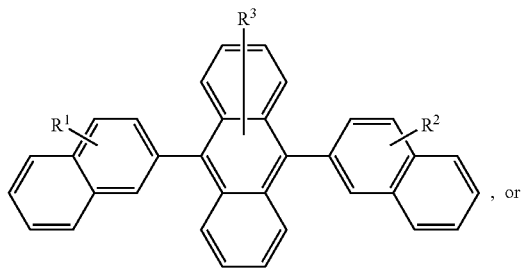
, or -continued
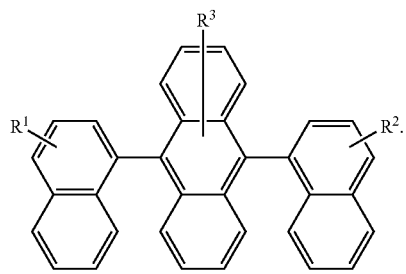
In one embodiment, the compound is compound 10:
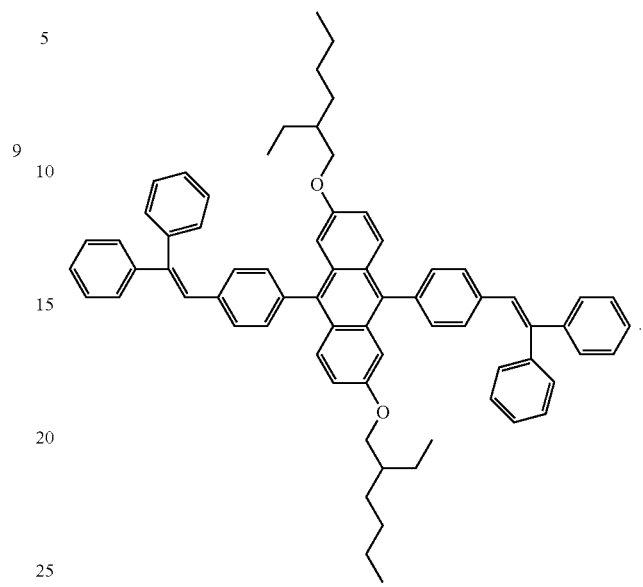
In one embodiment, the compound is at least one of compounds 11-31:
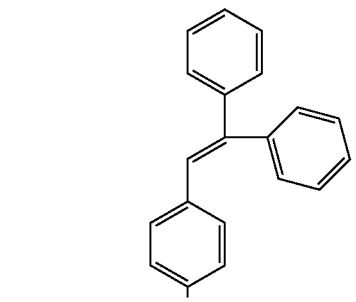
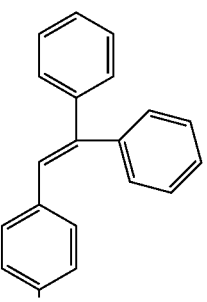
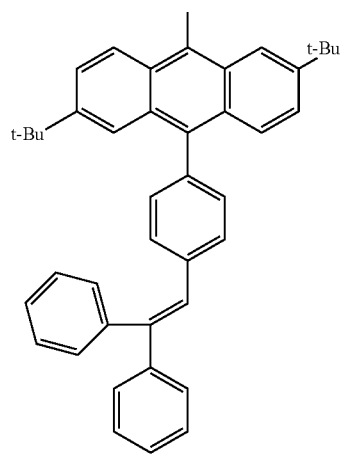 / 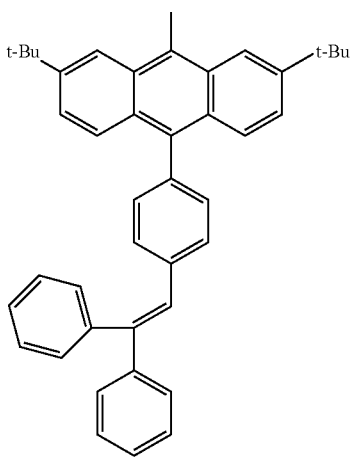

-continued
12
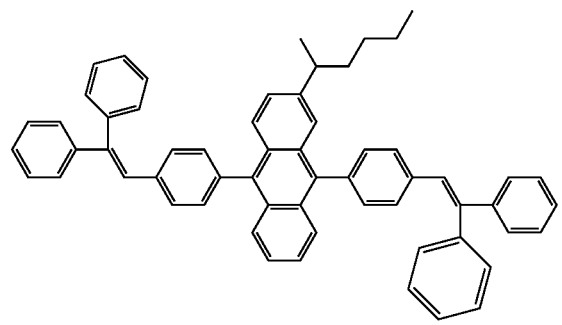
13
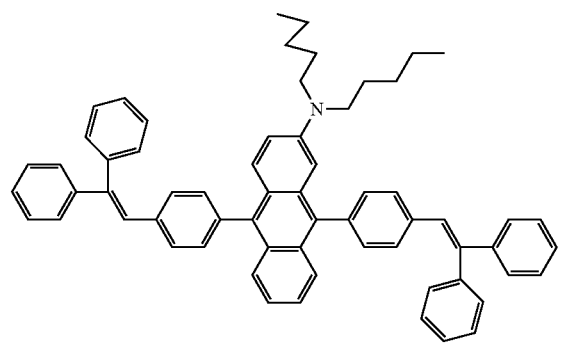
14
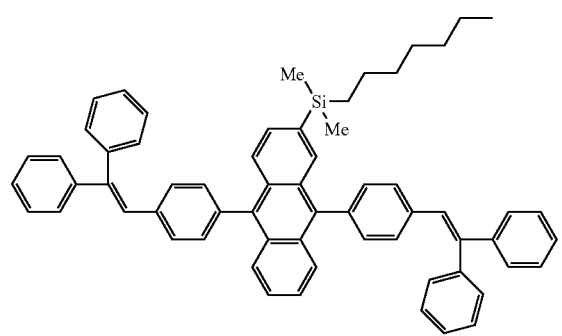
15
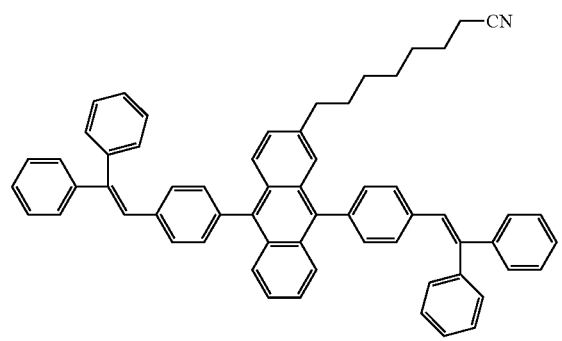

16
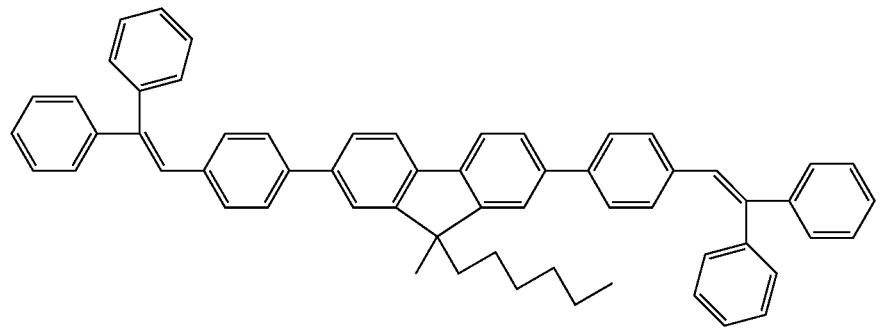
17
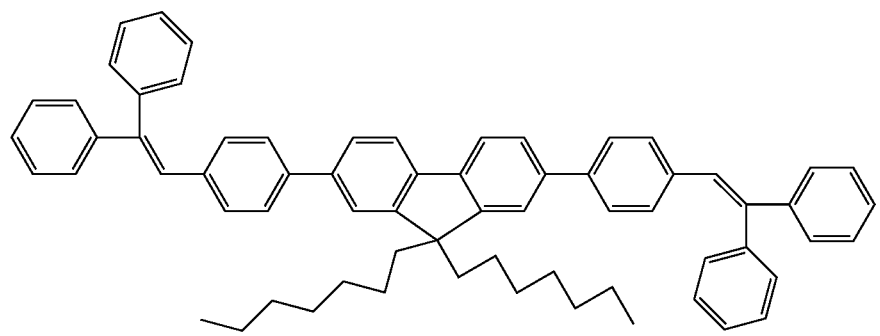
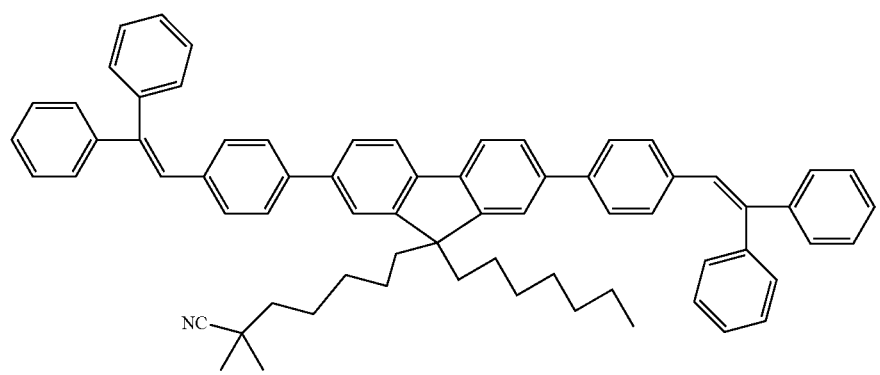
19
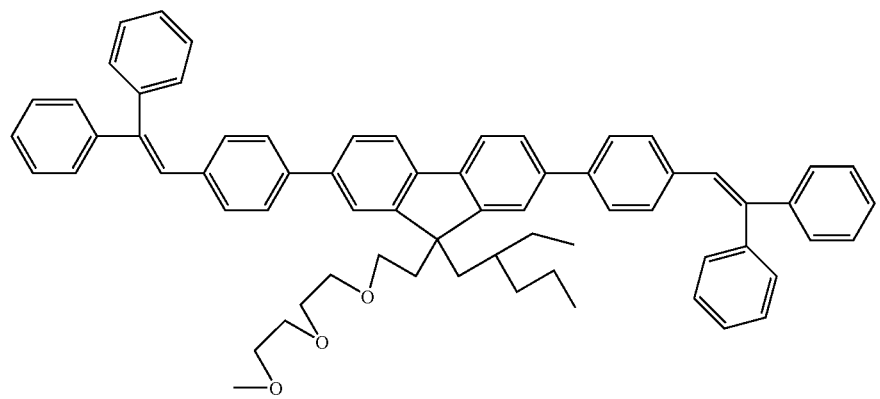

-continued
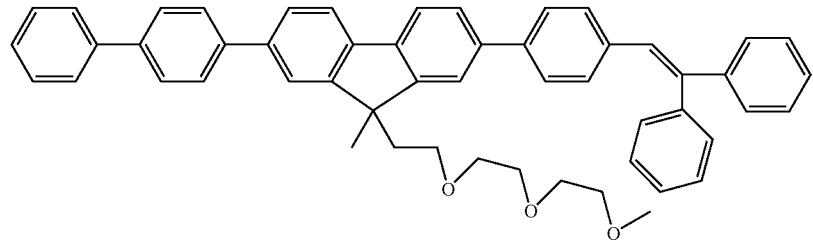
20
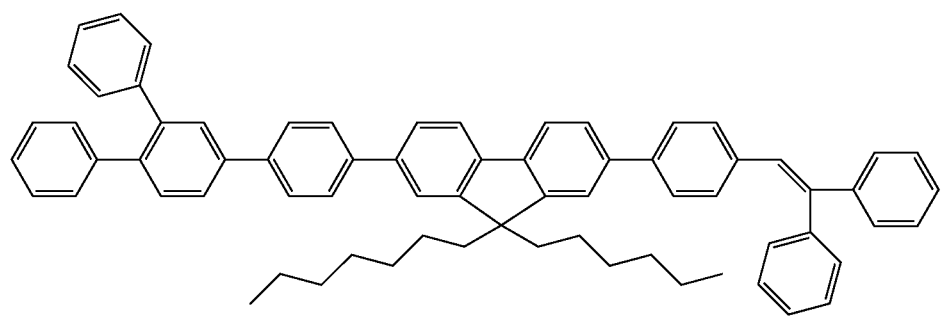
21
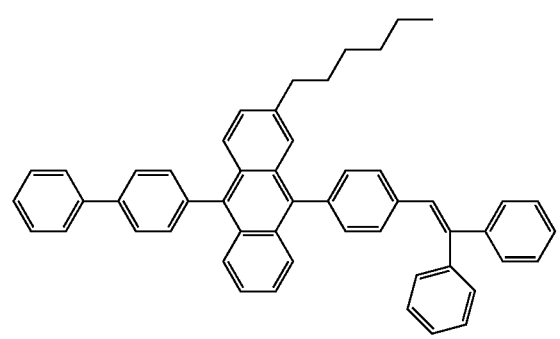
22
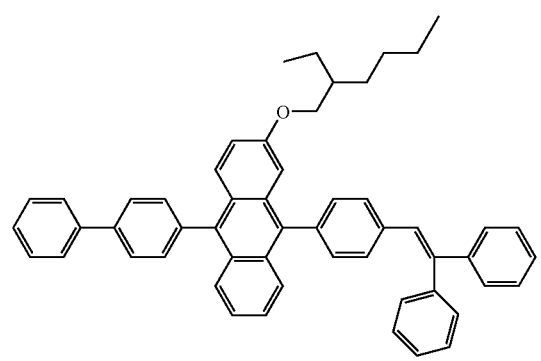
23

24
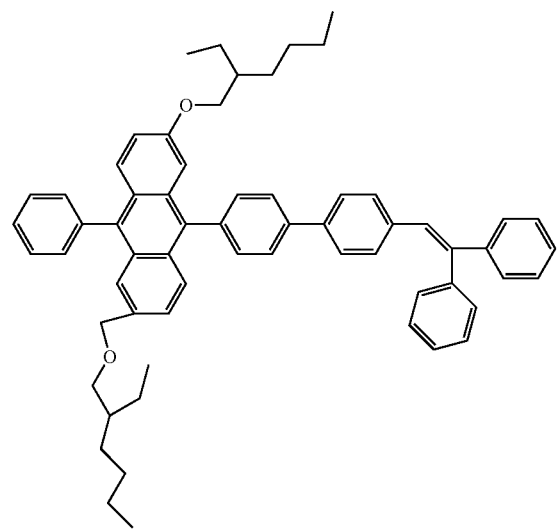
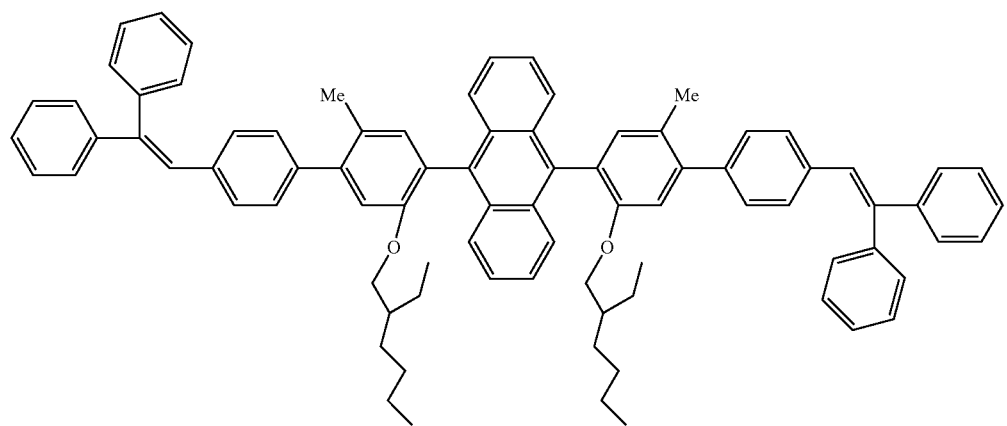
26
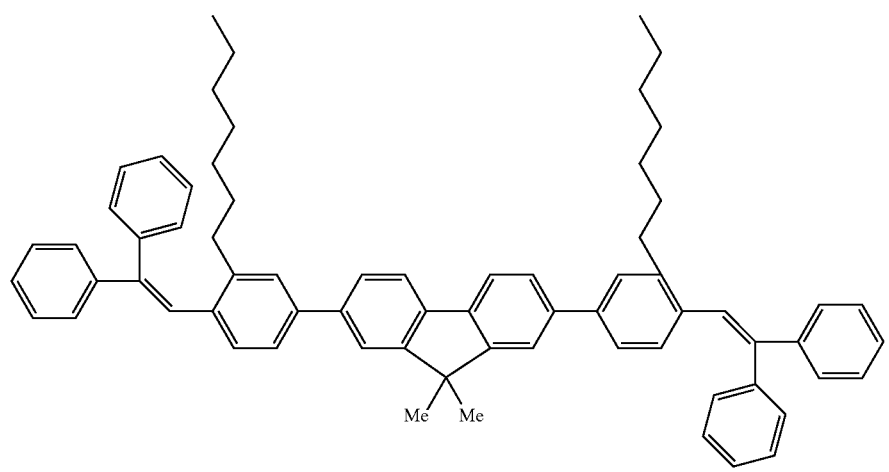

-continued
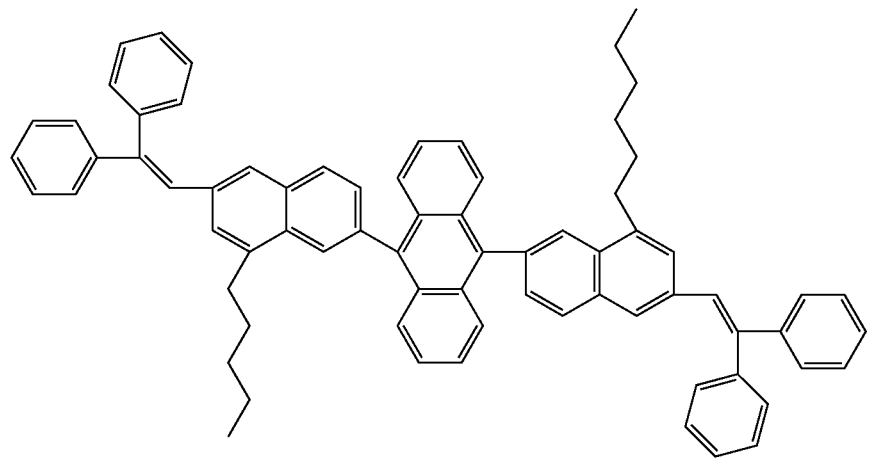
27
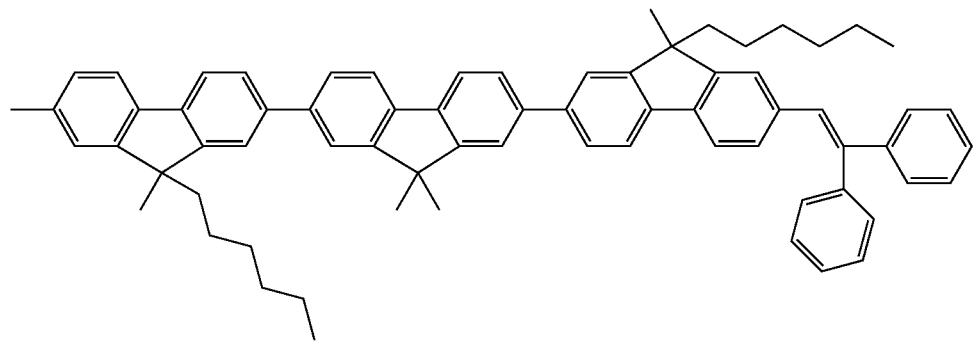
28
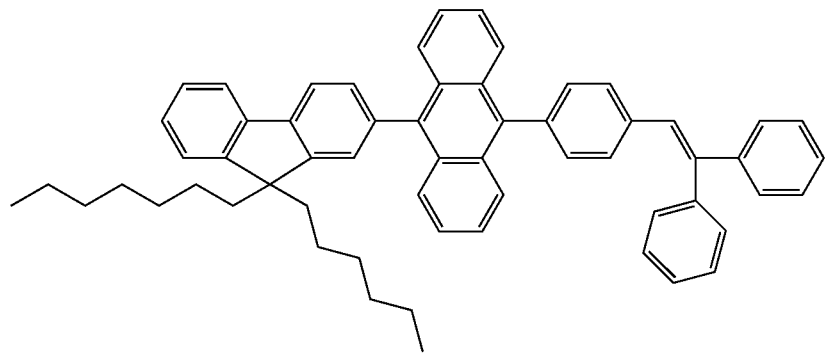
29
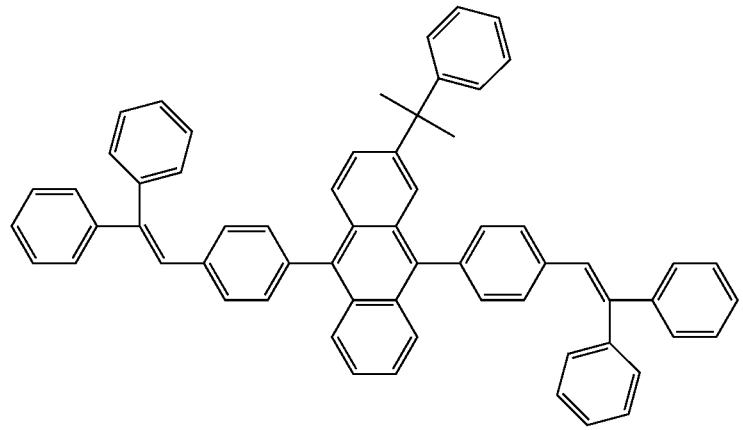
30

-continued

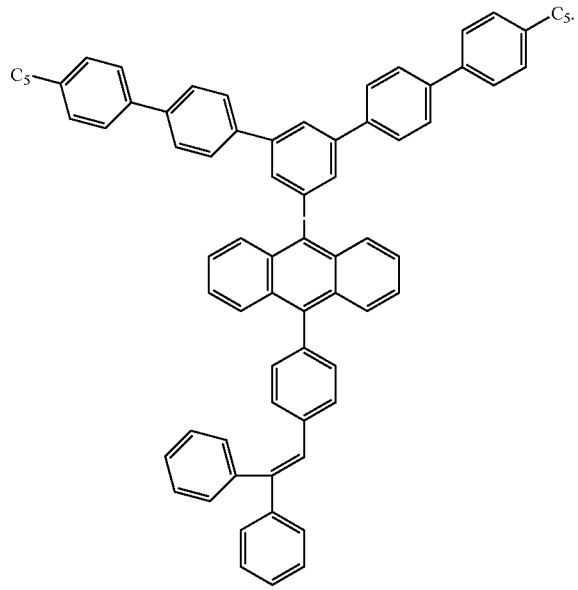

31

In one embodiment, the compounds are of Formula 32:

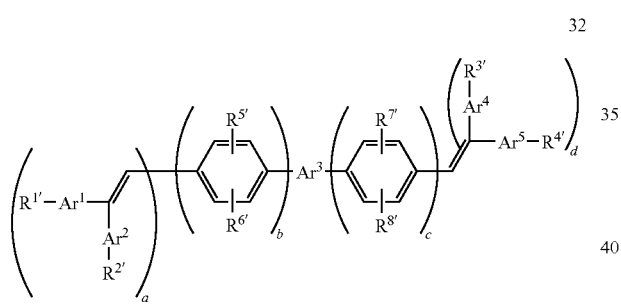

32 wherein:

$Ar^1$, $Ar^2$, $Ar^4$ and $Ar^5$ are, independently, an aryl, while $Ar^3$ is anthrylene or fluorenylene;

$R^{1'}$, $R^{2'}$, $R^{3'}$, and $R^{4'}$ are, independently, hydrogen, $C_1$-$C_{20}$ alkyl, $C_1$-$C_{20}$ alkoxy, $C_6$-$C_{20}$ aryl, $C_3$-$C_{20}$ trialkylsilyl, or cyano;

$R^{5'}$, $R^{6'}$, $R^{7'}$, and $R^{8'}$ are, independently, hydrogen, halogen, hydroxyl, amino, nitro, cyano, $C_1$-$C_{30}$ alkyl, $C_2$-$C_{30}$ alkenyl, $C_5$-$C_{30}$ cycloalkyl, $C_1$-$C_{30}$ alkoxy, $C_6$-$C_{30}$ aryl, $C_5$-$C_{30}$ heteroaryl, $C_7$-$C_{30}$ aralkyl, $C_6$-$C_{30}$ aryloxy, $C_2$-$C_{30}$ alkoxycarbonyl, or carboxyl;

a and b are, independently, 0 or 1;

c is an integer of 0 to 3; and d is an integer of 1 to 3.

In one embodiment, $R^{5'}$ and $R^{6'}$ can be bonded together, and, separately, $R^{7'}$ and $R^{8'}$ can be bonded to each other to form ring structures.

Dopants

In one embodiment, arylamines are commonly referred to as dopants in light emitting layer fabrication.

In one embodiment, the arylamines are of Formulae 33-37:

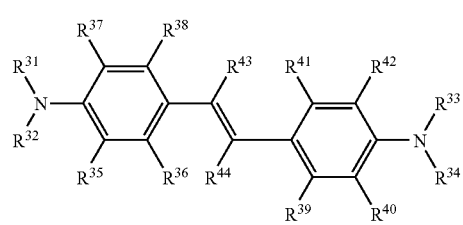

33

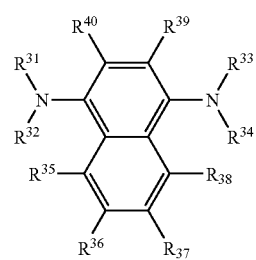

34

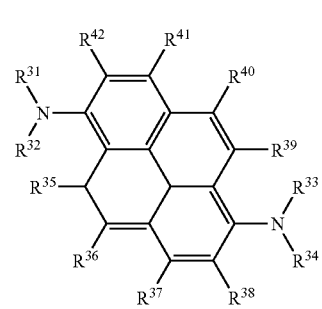

35

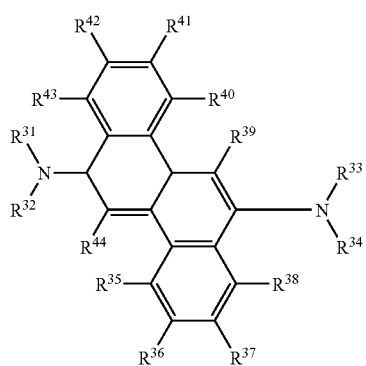

36

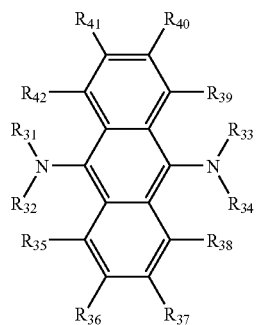

37 wherein $R^{31}$ to $R^{34}$ is, independently, aryl; and $R^{35}$ to $R^{44}$ is, independently, hydrogen, alkyl, or aryl.

In one embodiment, the arylamines are compound 38 (WO 2004/018588 A1):

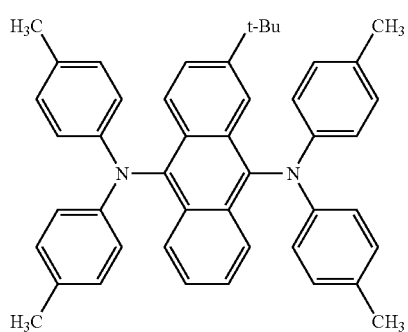

38

Compounds having Formulae 33-36 are generally known to form light emitting layers that emit blue light when activated, and can be referred to as blue emitters. In contrast, compounds having the Formula 37 are generally known to form light emitting layers that emit green light when activated, and can be referred to as green emitters.

In one embodiment, the arylamine is described in WO 02/20459 and has the structure of compound 38A:

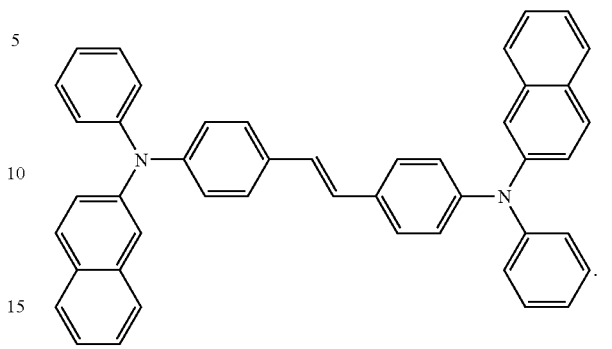

38A

In one embodiment, the arylamines are of Formulae 39 or 40.

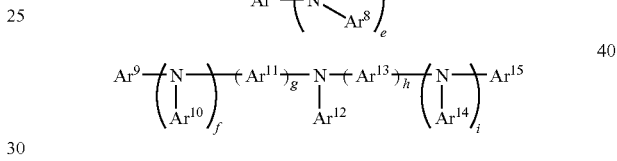

39

40 wherein $Ar^6$ is $C_6$-$C_{40}$ aryl;

$Ar^7$ and $Ar^8$ are independently, hydrogen or $C_6$-$C_{40}$ aryl;

$Ar^9$ and $Ar^{15}$ is, independently, $C_6$-$C_{40}$ aryl;

$Ar^{10}$, $Ar^{11}$, $Ar^{12}$, $Ar^{13}$, and $Ar^{14}$ are, independently, hydrogen or $C_6$-$C_{40}$ aryl;

a is an integer from 1 to 6; and f, g, h and i are, independently, 0 or 1.

In one embodiment, the $C_6$-$C_{40}$ aryl moieties can be either phenyl, naphthyl, anthranyl, phenanthryl, pyrenyl, cholonyl, biphenyl, terphenyl, pyrrolyl, furanyl, thiophenyl, benzothiophenyl, oxadiazolyl, diphenylanthranyl, indolyl, carbazolyl, pyridyl, benzoquinolyl, fluoranthenyl, acenaphthofluoranthenyl, and arylene groups such as phenylene, naphthylene, anthranylene, phenanthrylene, pyrenylene, cholonylene, biphenylene, terphenylene, pyrrolylene, furanylene, thiophenylene, benzothiophenylene, oxadiazolylene, diphenylanthranylene, indolylene, carbozolylene, pyridylene, benzoquinolylene, fluoranthenylene, acenaphthofluoranthenylene and the like. Such moieties can also be further substituted, preferable substituents being $C_1$-$C_6$ alkyl, e.g., ethyl, methyl, i-propyl, n-propyl, s-butyl, t-butyl, pentyl, hexyl or cyclohexyl, $C_1$-$C_6$ alkoxy, e.g., ethoxy, methoxy, i-propoxy, n-propoxy, s-butoxy, t-butoxy, pentoxy, hexyloxy, cyclopentoxy or cyclohexyloxy, aryl group having 5-40 nuclear constituent atoms, an amino group substituted with an aryl group having 5-40 nuclear constituent atoms, an ester group having an alkyl group of $C_1$-$C_6$, cyano group, nitro group, halogen atom and the like.

In one embodiment, the composition can contain aromatic heterocyclic compounds having a styryl group, such as, for example, N,N'''-diphenyl-N,N'-bis(4-styrylphenyl)-1,4-diaminonaphthalene, N,N'-diphenyl-N,N'-bis(4-styrylphenyl)-1,4-diamino-2,3-dimethylnaphthalene, N,N'-diphenyl-N,N'-bis(4-styrylphenyl)-3,8-diaminopyrene, N,N'-diphenyl-N, N'-bis(4-styrylphenyl)-9,10-diaminoanthracene, N,N'-diphenyl-N,N'-bis(4-styrylphenyl)-3,9-diaminoperylene and the like.

In one embodiment, the compositions are used in a layer. In one embodiment, the layer is a photoactive layer. In one embodiment, the layer is an emitter layer.

In one embodiment, the host and dopant materials provide high color purity [Blue: CIE (x,y)<(0.20, 0.20); Green: x<0.35, y>0.60] and high efficiency (Blue: >3 cd/A; Green: >15 cd/A) in OLED devices. In one embodiment, the host and dopant materials are, respectively, distyrylarylene and arylamine.

Hole Transport Layer

In one embodiment, a hole transport layer is disposed adjacent to a layer formed from the composition comprising the host and dopant. In one embodiment, the hole transport layer includes arylamines.

In one embodiment, the arylamines are poly(tertiary di- or polyarylamines) further substituted with, on average, more than one aryl moiety, which can also be further substituted with a moiety capable of chain extension or crosslinking. Such compounds are provided in U.S. Pat. No. 5,929,194, which is hereby incorporated by reference in its entirety.

In one embodiment, the arylamines are the poly(arylamines) of those of U.S. Pat. No. 5,728,801, which is hereby incorporated by reference in its entirety.

In one embodiment, the arylamines are the poly(arylamines) of those of U.S. Pat. No. 5,948,552, which is hereby incorporated by reference in its entirety.

In one embodiment, the arylamines are N,N'-diphenyl-N,N'-di-(4-chlorophenyl)-1,4-phenylenediamine.

In one embodiment, the arylamines are poly(tertiary di- or polyarylamines) having the formula such as that disclosed in U.S. Pat. No. 5,929,194, which is hereby incorporated by reference in its entirety.

In one embodiment, the arylamines are polymers having monomeric units of Formula 41:

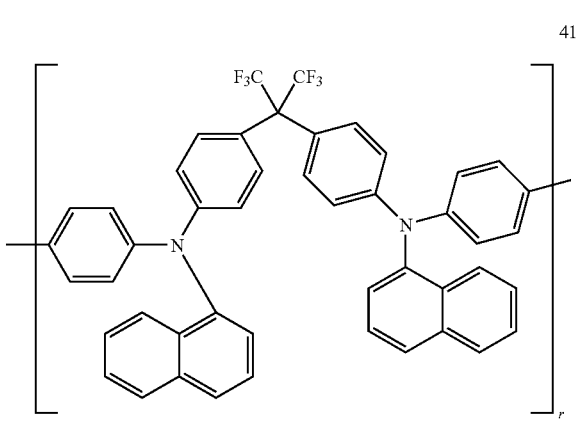

wherein r is an integer of at least 1.

In one embodiment, the arylamines have Formulae 42 or 43:

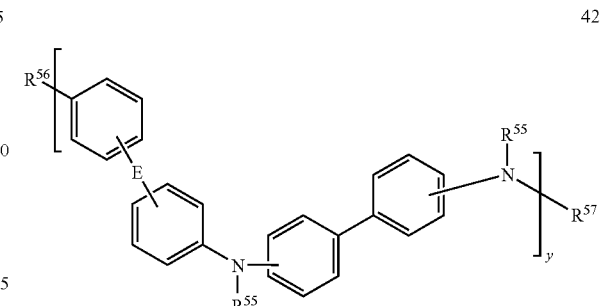

42

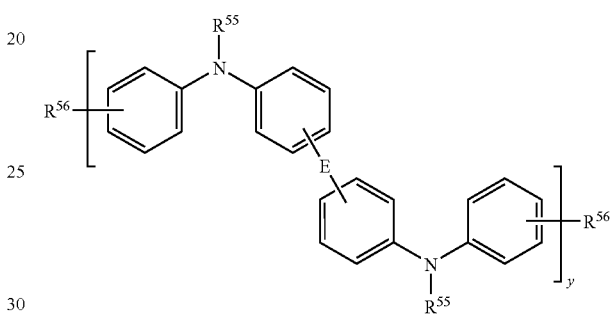

43 wherein n is an integer of at least 1;

$R^{55}$ is aryl, heteroaryl, fluoroaryl, or fluoroheteroaryl;

$R^{57}$ is either H or $R^{55}$; and $R^{56}$ is H, $R^{55}$, alkyl, fluoroalkyl, Cl, Br, I, or an arylamino group of Formula 44,

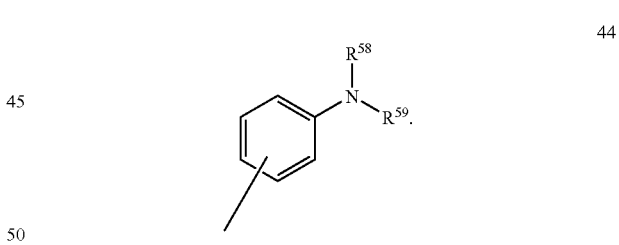

44 wherein $R^{58}$ is aryl, H, $R^{55}$, alkyl, or fluoroalkyl;

$R^{59}$ is aryl, heteroaryl, fluoroaryl, or fluoroheteroaryl;

$R^{60}$ and $R^{61}$ are, independently, H, F, alkyl, aryl, alkoxy, aryloxy, fluoroalkyl, fluoroaryl, fluoroalkoxy, or fluoroaryloxy; and E is O; S; $(SiR^{60}R^{61})_z$, wherein m is an integer of 1 to 20; $(CR^{60}R^{61})_z$, wherein m is an integer of 1 to 20; and combinations thereof;

optionally, $R^{60}$ and $R^{61}$ can, together, form a non-aromatic ring provided that when E is $(CR^{60}R^{61})_z$, and y is greater than 1 and z is 1, at least one of $R^{60}$ and $R^{61}$ is not a hydrogen or a hydrocarbon.

In one embodiment, the arylamines have Formula 45:

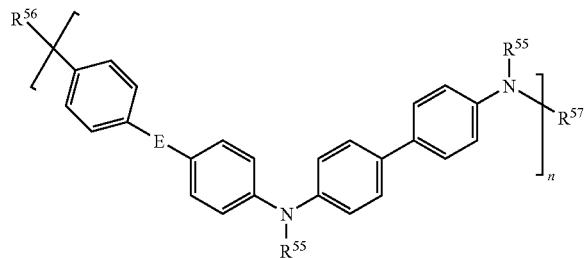

In one embodiment, the arylamines have Formula 46:

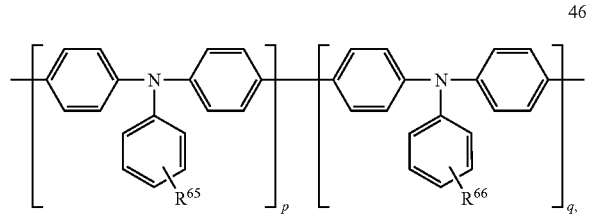

wherein $R^{65}$ and $R^{66}$ are, independently, aryl; and p and q are, independently, an integer of at least 1.

Hole Injection Layers

In one embodiment, a buffer layer is disposed adjacent to a layer formed from the composition comprising the host and dopant.

In one embodiment, the layer is a charge transport layer comprising electronically conductive polymer materials. In one embodiment, the electronically conductive polymer materials comprise electronically conductive polymer materials such as polyaniline, polypyroles, and mixtures thereof, polydioxythiophenes and at least one colloid-forming polymeric acid. See for example U.S. Ser. No. 10/669,494 filed Sep. 24, 2003, U.S. Ser. No. 10/669,577, filed Sep. 24, 2003, U.S. Ser. No. 10/802,341 filed Mar. 17, 2004, U.S. Ser. No. 10/802,704 filed Mar. 17, 2004, U.S. Ser. No. 10/803,114 filed Mar. 17, 2004, U.S. Ser. No. 10/804,503 filed Mar. 19, 2004, and U.S. Ser. No. 10/802,138 filed Mar. 17, 2004, which are incorporated by reference herein. In certain of those embodiments, the polydioxythiophenes are poly(3,4-ethylenedioxythiophene) and the polymeric acid is a fluorinated sulfanic acid polymer such as Nafion® polymeric acid, available from E.I. DuPont de Nemours and Company. The polydioxythiophenes can be compounds having the following structure:

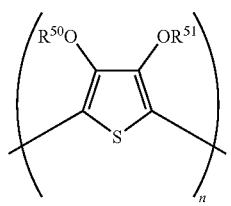

wherein $R^{50}$ and $R^{51}$ are, independently, hydrogen or an alkyl having 1 to 4 carbon atoms or $R^{50}$ and $R^{51}$ together form an alkylene chains having 1 to 4 carbon atoms, optionally substituted with alkyl or aromatic groups having 1 to 12 carbon atoms, or a 1,2-cyclohexylene radical; and n is an integer of at least 6.

The colloid-forming polymeric acids can be either polymeric sulfonic acids, polymeric carboxylic acids, or polymeric phosphoric acids.

Though these compounds have been mentioned as materials for forming charge transport layers, the disclosure is not limited to only such layers. These compounds along with other known compounds for forming charge transport layers are readily available and understood by a skilled artisan and are contemplate herein.

In one embodiment, compositions are provided comprising the above-described compositions and at least one solvent, processing aid, charge transporting material, or charge blocking material. These compositions can be in any form, including, but not limited to solvents, emulsions, and colloidal dispersions.

Device

Referring to FIG. 1, an exemplary organic electronic device 100 is shown. The device 100 includes a substrate 105. The substrate 105 may be rigid or flexible, for example, glass, ceramic, metal, or plastic. When voltage is applied, emitted light is visible through the substrate 105.

A first electrical contact layer 110 is deposited on the substrate 105. For illustrative purposes, the layer 110 is an anode layer. Anode layers may be deposited as lines. The anode can be made of, for example, materials containing or comprising metal, mixed metals, alloy, metal oxides or mixed-metal oxide. The anode may comprise a conducting polymer, polymer blend or polymer mixtures. Suitable metals include the Group 11 metals, the metals in Groups 4, 5, and 6, and the Group 8, 10 transition metals. If the anode is to be light-transmitting, mixed-metal oxides of Groups 12, 13 and 14 metals, such as indium-tin-oxide, are generally used. The anode may also comprise an organic material, especially a conducting polymer such as polyaniline, including exemplary materials as described in *Flexible Light-Emitting Diodes Made From Soluble Conducting Polymer*, Nature 1992, 357, 477-479. At least one of the anode and cathode should be at least partially transparent to allow the generated light to be observed.

An optional buffer layer 120, such as hole transport materials, may be deposited over the anode layer 110, the latter being sometimes referred to as the "hole-injecting contact layer." Examples of hole transport materials suitable for use as the layer 120 have been summarized, for example, in Kirk Othmer, Encyclopedia of Chemical Technology, Vol. 18, 837-860 (4$^{th}$ ed. 1996). Both hole transporting "small" molecules as well as oligomers and polymers may be used. Hole transporting molecules include, but are not limited to: N,N' diphenyl-N,N'-bis(3-methylphenyl)-[1,1'-biphenyl]-4,4'-diamine (TPD), 1,1 bis[(di-4-tolylamino)phenyl]cyclohexane (TAPC), N,N' bis(4-methylphenyl)-N,N'-bis(4-ethylphenyl)-[1,1'-(3,3'-dimethyl)biphenyl]-4,4'-diamine (ETPD), tetrakis (3-methylphenyl)-N,N,N',N'-2,5-phenylenediamine (PDA), a-phenyl 4-N,N-diphenylaminostyrene (TPS), p (diethylamino)benzaldehyde diphenylhydrazone (DEH), triphenylamine (TPA), bis[4 (N,N-diethylamino)-2-methylphenyl](4-methylphenyl)methane (MPMP), 1 phenyl-3-[p-(diethylamino) styryl]-5-[p-(diethylamino)phenyl]pyrazoline (PPR or DEASP), 1,2 trans-bis(9H-carbazol-9-yl)cyclobutane (DCZB), N,N,N',N' tetrakis(4-methylphenyl)-(1,1'-biphenyl)-4,4'-diamine (TTB), and porphyrinic compounds, such as copper phthalocyanine. Useful hole transporting polymers include, but are not limited to, polyvinylcarbazole, (phenylmethyl)polysilane, and polyaniline. Conducting polymers are useful as a class. It is also possible to obtain hole transporting polymers by doping hole transporting moieties, such as those mentioned above, into polymers such as polystyrenes and polycarbonates.

An organic layer 130 may be deposited over the buffer layer 120 when present, or over the first electrical contact layer 110. In one embodiment, the organic layer 130 may be a number of discrete layers comprising a variety of components. Depending upon the application of the device, the organic layer 130 can be a light-emitting layer that is activated by an applied voltage (such as in a light-emitting diode or light-emitting electrochemical cell), or a layer of material that responds to radiant energy and generates a signal with or without an applied bias voltage (such as in a photodetector).

Other layers in the device can be made of any materials which are known to be useful in such layers upon consideration of the function to be served by such layers.

Any organic electroluminescent ("EL") material can be used as a photoactive material (e.g., in layer 130). Such materials include, but are not limited to, fluorescent dyes, small molecule organic fluorescent compounds, fluorescent and phosphorescent metal complexes, conjugated polymers, and mixtures thereof. Examples of fluorescent dyes include, but are not limited to, pyrene, perylene, rubrene, derivatives thereof, and mixtures thereof. Examples of metal complexes include, but are not limited to, metal chelated oxinoid compounds, such as tris(8-hydroxyquinolato)aluminum (Alq3); cyclometalated iridium and platinum electroluminescent compounds, such as complexes of Iridium with phenylpyridine, phenylquinoline, or phenylpyrimidine ligands as disclosed in Petrov et al., Published PCT Application WO 02/02714, and organometallic complexes described in, for example, published applications US 2001/0019782, EP 1191612, WO 02/15645, and EP 1191614; and mixtures thereof. Electroluminescent emissive layers comprising a charge carrying host material and a metal complex have been described by Thompson et al., in U.S. Pat. No. 6,303,238, and by Burrows and Thompson in published PCT applications WO 00/70655 and WO 01/41512. Examples of conjugated polymers include, but are not limited to poly(phenylenevinylenes), polyfluorenes, poly(spirobifluorenes), polythiophenes, poly(p-phenylenes), copolymers thereof, and mixtures thereof.

In one embodiment of the devices of the invention, photoactive material can be an organometallic complex. In another embodiment, the photoactive material is a cyclometalated complex of iridium or platinum. Other useful photoactive materials may be employed as well. Complexes of iridium with phenylpyridine, phenylquinoline, or phenylpyrimidine ligands have been disclosed as electroluminescent compounds in Petrov et al., Published PCT Application WO 02/02714. Other organometallic complexes have been described in, for example, published applications US 2001/0019782, EP 1191612, WO 02/15645, and EP 1191614. Electroluminescent devices with an active layer of polyvinyl carbazole (PVK) doped with metallic complexes of iridium have been described by Burrows and Thompson in published PCT applications WO 00/70655 and WO 01/41512. Electroluminescent emissive layers comprising a charge carrying host material and a phosphorescent platinum complex have been described by Thompson et al., in U.S. Pat. No. 6,303,238, Bradley et al., in Synth. Met. 2001, 116 (1-3), 379-383, and Campbell et al., in Phys. Rev. B, Vol. 65 085210.

A second electrical contact layer 160 is deposited on the organic layer 130. For illustrative purposes, the layer 160 is a cathode layer.

Cathode layers may be deposited as lines or as a film. The cathode can be any metal or nonmetal having a lower work function than the anode. Exemplary materials for the cathode can include alkali metals, especially lithium, the Group 2 (alkaline earth) metals, the Group 12 metals, including the rare earth elements and lanthanides, and the actinides. Materials such as aluminum, indium, calcium, barium, samarium and magnesium, as well as combinations, can be used. Lithium-containing and other compounds, such as LiF and $Li_2O$, may also be deposited between an organic layer and the cathode layer to lower the operating voltage of the system.

An electron transport layer 140 or electron injection layer 150 is optionally disposed adjacent to the cathode, the cathode being sometimes referred to as the "electron-injecting contact layer."

An encapsulation layer 170 is deposited over the contact layer 160 to prevent entry of undesirable components, such as water and oxygen, into the device 100. Such components can have a deleterious effect on the organic layer 130. In one embodiment, the encapsulation layer 170 is a barrier layer or film.

Though not depicted, it is understood that the device 100 may comprise additional layers. For example, there can be a layer (not shown) between the anode 110 and hole transport layer 120 to facilitate positive charge transport and/or bandgap matching of the layers, or to function as a protective layer. Other layers that are known in the art or otherwise may be used. In addition, any of the above-described layers may comprise two or more sub-layers or may form a laminar structure. Alternatively, some or all of anode layer 110 the hole transport layer 120, the electron transport layers 140 and 150, cathode layer 160, and other layers may be treated, especially surface treated, to increase charge carrier transport efficiency or other physical properties of the devices. The choice of materials for each of the component layers is preferably determined by balancing the goals of providing a device with high device efficiency with device operational lifetime considerations, fabrication time and complexity factors and other considerations appreciated by persons skilled in the art. It will be appreciated that determining optimal components, component configurations, and compositional identities would be routine to those of ordinary skill of in the art.

In one embodiment, the different layers have the following range of thicknesses: anode 110, 500-5000 Å, in one embodiment 1000-2000 Å; hole transport layer 120, 50-2000 Å, in one embodiment 200-1000 Å; photoactive layer 130, 10-2000 Å, in one embodiment 100-1000 Å; layers 140 and

150, 50-2000 Å, in one embodiment 100-1000 Å; cathode 160, 200-10000 Å, in one embodiment 300-5000 Å. The location of the electron-hole recombination zone in the device, and thus the emission spectrum of the device, can be affected by the relative thickness of each layer. Thus the thickness of the electron-transport layer should be chosen so that the electron-hole recombination zone is in the light-emitting layer. The desired ratio of layer thicknesses will depend on the exact nature of the materials used.

In operation, a voltage from an appropriate power supply (not depicted) is applied to the device 100. Current therefore passes across the layers of the device 100. Electrons enter the organic polymer layer, releasing photons. In some OLEDs, called active matrix OLED displays, individual deposits of photoactive organic films may be independently excited by the passage of current, leading to individual pixels of light emission. In some OLEDs, called passive matrix OLED displays, deposits of photoactive organic films may be excited by rows and columns of electrical contact layers.

Devices can be prepared employing a variety of techniques. These include, by way of non-limiting exemplification, vapor deposition techniques and liquid deposition. Devices may also be sub-assembled into separate articles of manufacture that can then be combined to form the device.

Definitions

The use of "a" or "an" are employed to describe elements and components of the invention. This is done merely for convenience and to give a general sense of the invention. This description should be read to include one or at least one and the singular also includes the plural unless it is obvious that it is meant otherwise.

The term "active" when referring to a layer or material is intended to mean a layer or material that exhibits electronic or electro-radiative properties. An active layer material may emit radiation or exhibit a change in concentration of electron-hole pairs when receiving radiation. Thus, the term "active material" refers to a material which electronically facilitates the operation of the device. Examples of active materials include, but are not limited to, materials which conduct, inject, transport, or block a charge, where the charge can be either an electron or a hole. Examples of inactive materials include, but are not limited to, planarization materials, insulating materials, and environmental barrier materials.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

The term "layer" is used interchangeably with the term "film" and refers to a coating covering a desired area. The area can be as large as an entire device or a specific functional area such as the actual visual display, or as small as a single sub-pixel. Films can be formed by any conventional deposition technique, including vapor deposition and liquid deposition. Liquid deposition techniques include, but are not limited to, continuous deposition techniques such as spin coating, gravure coating, curtain coating, dip coating, slot-die coating, spray-coating, and continuous nozzle coating; and discontinuous deposition techniques such as ink jet printing, gravure printing, and screen printing.

The term "organic electronic device" is intended to mean a device including one or more semiconductor layers or materials. Organic electronic devices include, but are not limited to: (1) devices that convert electrical energy into radiation (e.g., a light-emitting diode, light emitting diode display, diode laser, or lighting panel), (2) devices that detect signals through electronic processes (e.g., photodetectors photoconductive cells, photoresistors, photoswitches, phototransistors, phototubes, infrared ("IR") detectors, or biosensors), (3) devices that convert radiation into electrical energy (e.g., a photovoltaic device or solar cell), and (4) devices that include one or more electronic components that include one or more organic semiconductor layers (e.g., a transistor or diode). The term device also includes coating materials for memory storage devices, antistatic films, biosensors, electrochromic devices, solid electrolyte capacitors, energy storage devices such as a rechargeable battery, and electromagnetic shielding applications.

The term "substrate" is intended to mean a workpiece that can be either rigid or flexible and may include one or more layers of one or more materials, which can include, but are not limited to, glass, polymer, metal, or ceramic materials, or combinations thereof.

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. All publications, patent applications, patents, and other references mentioned herein are incorporated by reference in their entirety, unless a particular passage is cited. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductive member arts.

EXAMPLES

The concepts described herein will be further described in the following examples, which do not limit the scope of the invention described in the claims.

Compound Synthesis

The following examples, Examples A-D, are those described in PCT Publication WO 03/037836, which produce some of the distyrylarylenes of the present invention.

Example A

Synthesis of Compound 10

The route of the synthesis of compound 10, or 9,10-bis[4-(2,2-diphenylethenyl)phenyl]-2,6-di(2-ethylhexyloxy)anthracene, is shown below.

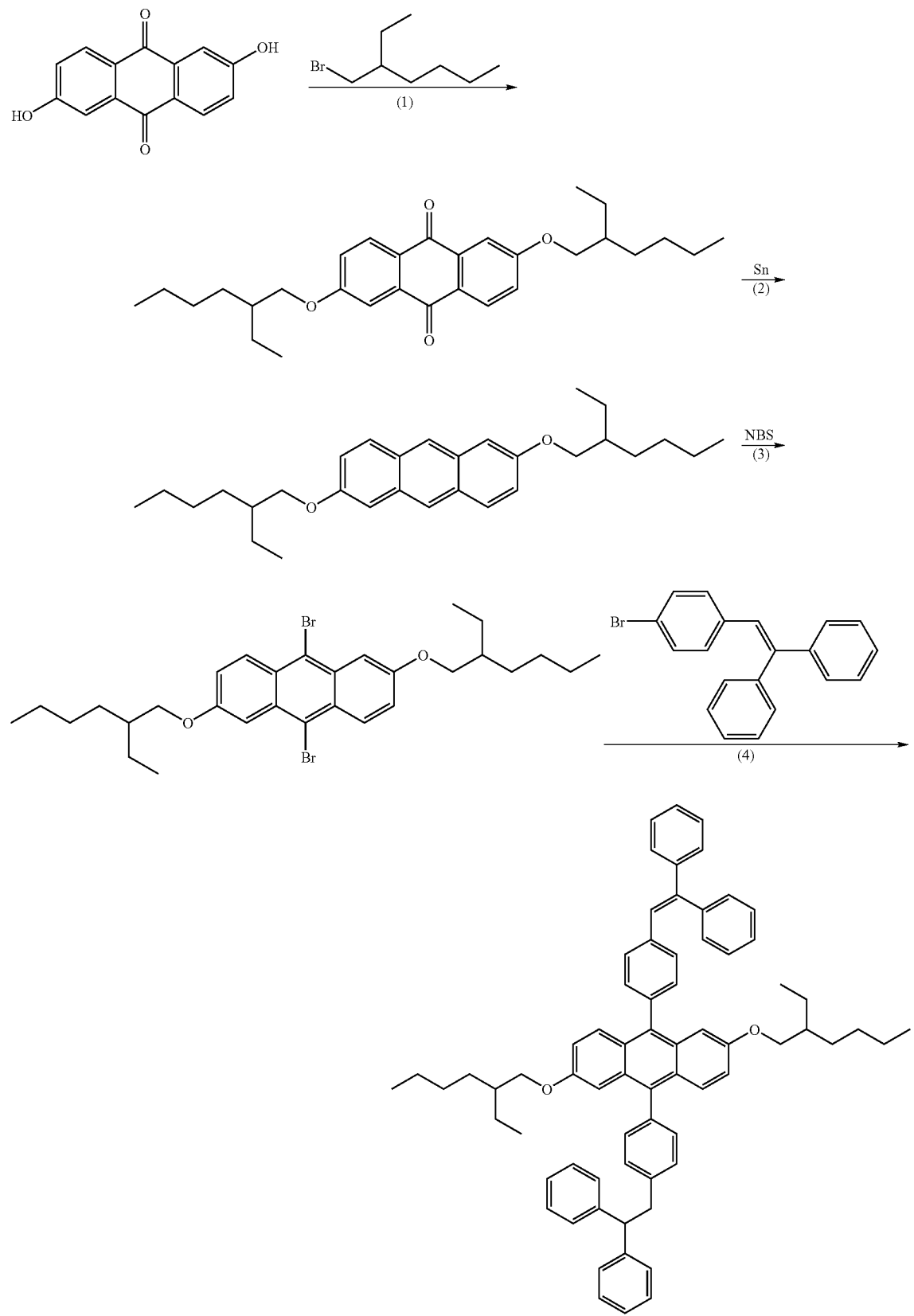

Step 1—Synthesis of 2,6-di(2-ethylhexyloxy) anthraquinone

Aliquoted into a 500 ml flask were 2,6-dihydroxyanthraquinone 10 g (42 m mole), 2-ethylhexylbromide 16.5 g (86 mmole), anhydrous potassium carbonate 12 g (87 mmole) and dimethylformamide (DMF) 200 ml, and they were heated at 90° C. with stirring overnight. After the completion of the reaction, DMF was distilled off and 50 ml of water was added. After the reaction solution was extracted with diethyl ether and washed with saturated salt water, it was dried with magnesium sulfate. After concentrating under reduced pressure, the crude product was recrystallized from methanol to give the targeted quinone substance 12.5 g (yield 65%, yellow powder).

Step 2—Synthesis of 2,6-di(2-ethylhexyloxy)anthracene

Aliquoted into a 200 ml flask were 2,6-di(2-ethylhexyloxy) anthraquinone 7.5 g (16 m mole), tin 8 g (67 mmole) and 37.5 ml of acetic acid. The mixture was heated and refluxed for 2 hrs. After the reaction solution was cooled to room temperature, the uppermost layer was decanted. The solids content was washed with methylene chloride, the organic layers were combined and washed with water, saturated sodium bicarbonate water and saturated salt water followed by drying with magnesium sulfate. Removal of solvent gave the yellow solid 7.2 g The yellow solid obtained was dissolved in isopropyl alcohol (IPA) 20 ml in a 200 ml three-necked flask, and NaBH4 0.65 g (17 mmole)/IPA 30 ml solution was added dropwise gradually, then they were heated with stirring overnight. After the completion of the reaction, water was added to the reaction solution. After the precipitates were filtered, they were washed with water and ethanol to give the targeted anthracene substance 5.5 g (yield 78%, yellow powder).

Step 3—Synthesis of 9,10-dibromo-2,6-di(2-ethylhexyloxy) anthracene

Aliquoted into a 200 ml three-necked flask were 2,6-di(2-ethylhexyloxy) anthracene 2.7 g (6 mmole) and DMF 20 ml. The mixture was cooled to 0° C. N-Bromosuccinimide (NBS) 2.3 g (12 mmole)/DMF 5 ml were added dropwise gradually to this suspension and they were stirred at room temperature overnight. After the completion of the reaction, the reaction solution was poured into water 100 ml followed by extraction with methylene chloride. The organic layer was washed with water, saturated sodium bicarbonate water and saturated salt water followed by drying with magnesium sulfate. After concentrating under reduced pressure, the dark brown residues were purified with silica chromatography (eluant solvent: hexane) to give the targeted dibromo substance 1.1 g (yield 30%, yellow powder).

Step 4—Synthesis of 9,10-bis[4(2,2-diphenylethenyl)phenyl]-2,6-di (2-ethylhexyloxy) anthracene (Compound 10)

Magnesium 0.16 g (6.6 mmole), a small sample of iodine and 10 ml of tetrahydrofuran (THF) were added to a 500 ml three-necked flask equipped with a condenser, under a gaseous stream of argon. After stirring at room temperature for 30 min, a solution of 1-(4-bromophenyl)-2,2-diphenylethylene 1 g (3 mmole)/THF 10 ml was added dropwise. After the completion of the dropwise addition, they were stirred at 60° C. for 1 hr to prepare a Grignard reagent.

Added into a 500 ml three-necked flask equipped with a condenser under a gaseous stream of argon were 9,10-dibromo-2,6-di(2-ethylhexyloxy) anthracene 0.6 g (1 mmole), dichlorobis(triphenylphosphine) palladium 0.04 g (5 mole %), diisobutylaluminum hydride/toluene solution 0.1 ml (1 M, 0.1 mmole) and THF 10 ml. After the above-mentioned Grignard reagent was added dropwise to them at room temperature, they were heated and stirred overnight. After the completion of the reaction, the reaction solution was cooled with ice water, the precipitates were filtered and washed with methanol 50 ml followed by acetone 50 ml to give the yellow powder 0.56 g. This was identified as Compound 10 by NMR, IR and field desorption mass spectra measurements (FD-MS) (yield 60%).

Example B

Synthesis of Compound 11

The synthetic route of compound 11, or 9,10-bis[4-(2,2-diphenylethenyl)phenyl-2,6/2,7-di-t-butylanthracene, is shown below.

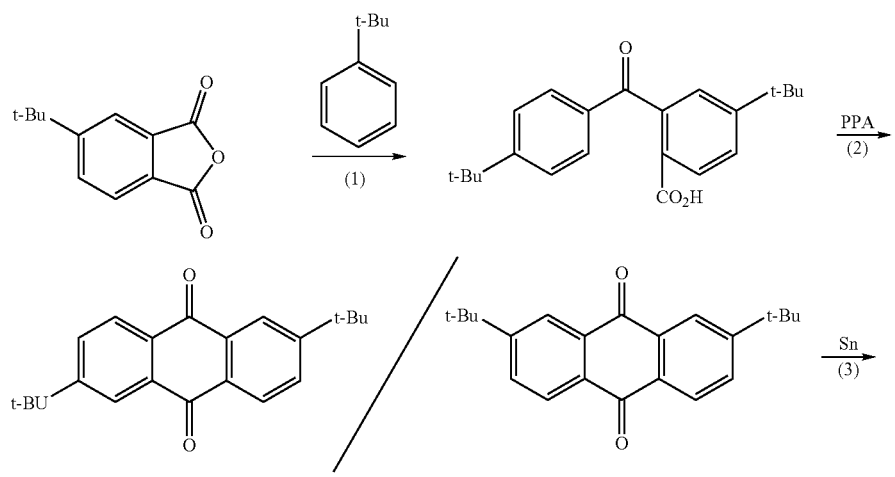

-continued

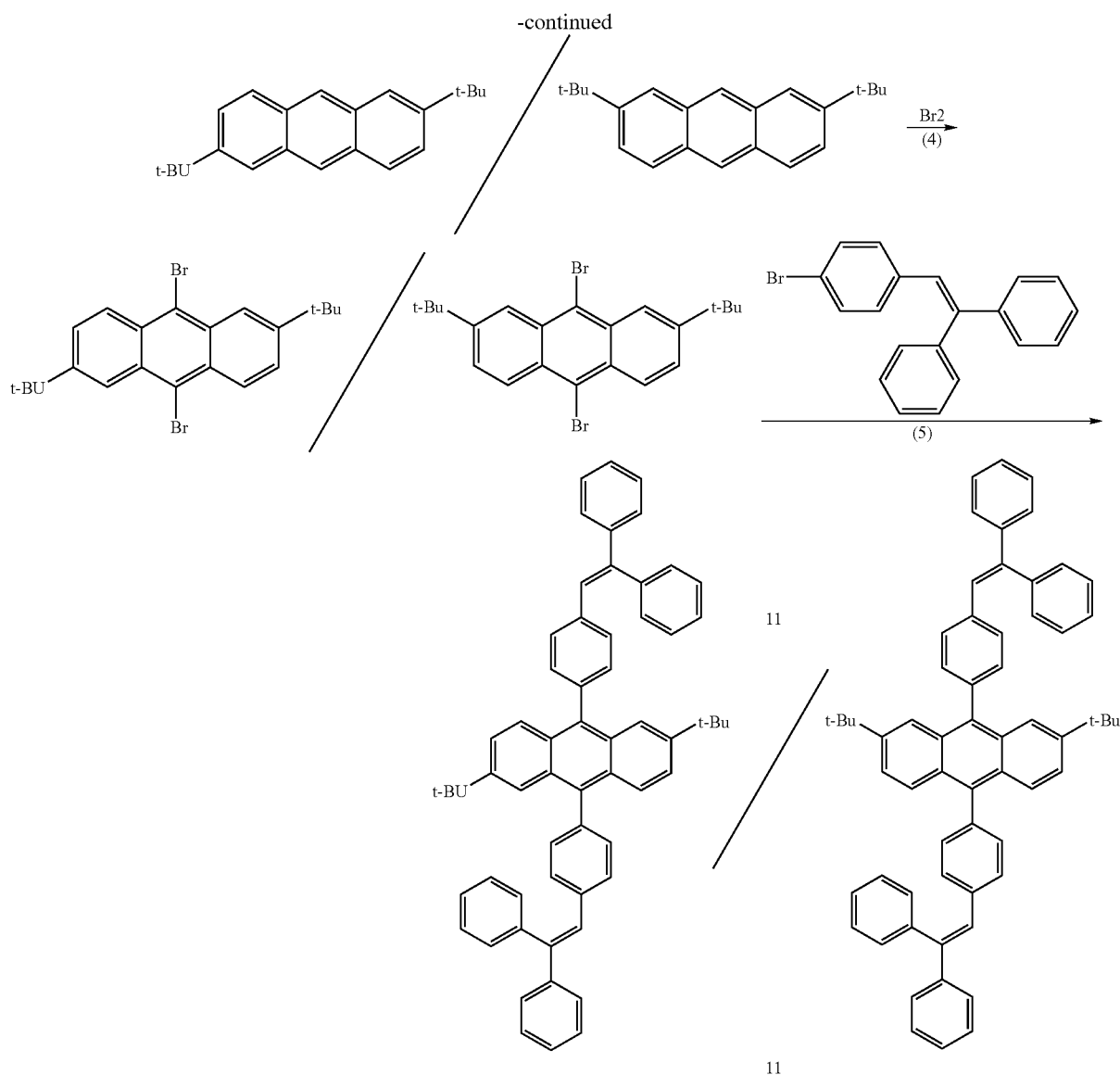

Step 1—Synthesis of 4-t-butyl-2-[4-t-butylbenzoyl)benzoic acid

Added into a 500 ml three-necked flask under the environment of argon were 4-t-butylphthalic anhydride 36 g (176 mmole), t-butylbenzene 27 g (200 mmole) and dichloroethane 100 ml. The mixture was cooled to 0° C. Aluminum chloride 56 g (420 mmole) was added gradually to them. After the addition, they were stirred at room temperature overnight. After the reaction, ice was added gradually followed by the addition of concentrated hydrochloric acid. After the precipitates were filtered, they were thoroughly washed to give the benzoic acid substance 32 g (yield 64%, white powder).

Step 2—Synthesis of 2,6/2,7-di-t-butyl-anthraquinone

Polyphosphoric acid 200 ml was added into a 500 ml flask equipped with a condenser, and heated to 150° C. Subsequently, 4-t-butyl-2-(4-t-butylbenzoyl)benzoic acid 32 g (95 mmole) was added little by little, and they were stirred at the same temperature for 3 hrs. After the completion of the reaction, the reaction product was poured into ice water and subjected to seperatory extraction. After dried with magnesium sulfate, it was concentrated under reduced pressure with a rotary evaporator. The crude crystals obtained were recrystallized from hexane to give the targeted anthraquinone substance 21 g (yield 69%, yellow crystals).

Step 3—Synthesis of 2,6/2,7-di-t-butyl-anthracene

Added into a 300 ml flask were di-t-butyl-anthraquinone 10 g (313 mmole), tin 18 g (151 mmole) and glacial acetic acid 50 ml, and they were heated with stirring. After the completion of the reaction, the reaction solution was poured into ice water and stirred for 30 min. It was extracted with methylene chloride. After dried with magnesium sulfate, it was concentrated under reduced pressure with a rotatory evaporator. The oily solid obtained was used further without purification for the subsequent reaction.

The above-mentioned oily solid was dissolved in isopropyl alcohol 110 ml in a 500 ml three-necked flask, and after NaBH$_4$ 13 g (333 mmole) was added to it gradually they were heated with stirring overnight. After the completion of the reaction, water was added to the reaction solution. After the precipitates were filtered, they were washed with water and ethanol to give the targeted anthracene substance 8.8 g (yield 97%, yellow powder).

Step 4—Synthesis of 2,6/2.7-di-t-butyl-9,10-dibromoanthracene

Di-t-butylanthracene 4 g (13.8 mmole) and carbon tetrachloride 150 ml were placed in a 300 ml flask, and bromine 1.42 ml (27 mmole) was added dropwise to them. After stirring at room temperature overnight, the reaction solution was poured into water 200 ml and extracted with methylene chloride. The organic layer was washed with water, saturated sodium bicarbonate water and saturated salt water followed by drying with magnesium sulfate. After concentrating under reduced pressure, the yellow solid was recrystallized from ethanol to give the targeted dibromoanthracene substance 6 g (yield 97%, yellow powder).

Step 5—Synthesis of 9,10-bis[4(2,2-diphenylethenyl)phenyl]-2,6/2,7-di-t-butylanthracene (Compound 11)

Magnesium 0.16 g (6.6 mmole), a small sample of iodine and THF 10 ml were added to a 500 ml three-necked flask equipped with a condenser under a gaseous stream of argon. After stirring at room temperature for 30 min, a solution of 1-(4-bromophenyl)-2,2-diphenylethylene 1 g (3 mmole)/ THF 10 ml was added dropwise. After the completion of the dropwise addition, they were stirred at 60° C. for 1 hr to prepare a Grignard reagent.

Added into a 500 ml three-necked flask equipped with a condenser under a gaseous stream of argon were 2,6/2,7-di-t-9,10-dibromoanthracene 0.45 g (1 mmole), dichlorobis(triphenylphosphine) palladium 0.04 g (5 mole %), diisobutylaluminum hydride/toluene solution 0.1 ml (1 M, 0.1 mmole) and THF 10 ml. After the above-mentioned Grignard reagent was added dropwise to them at room temperature, they were heated and stirred overnight. After the completion of the reaction, the reaction solution was cooled with ice water, and the precipitates were filtered and washed with methanol 50 ml and acetone 50 ml, in that order, to yield the yellow powder 0.4 g. This was identified as compound 11 by NMR, IR and FD-MS measurements (yield 50%).

Example C

Synthesis of Compound 30

Step 1—Synthesis of 2-(2-phenyl-2-propyl)-9,10-bis (4-(2,2-diphenylvinyl)phenyl)-9,10-dihydro-9,10-dihydroxyanthracene Under the argon environment, 4-(2,2-diphenylvinyl) bromobenzene (10 g, 30 mmole) was dissolved in a mixed solvent of anhydrous toluene (45 ml) and anhydrous THF, and cooled to –20° C. with a dry ice-methanol bath. Added to this was n-butyllithium/hexane solution (1.59 mole/l, 20 ml, 32 mmole, 1.06 eq), and they were stirred at –20° C. for 1 hr. Added to this was 2-(2-phenyl-2-)propylanthraquinone (3.5 g, 11 mmole) and they were stirred at room temperature for 3 hrs followed by being left standing overnight. A saturated aqueous ammonium chloride solution (50 ml) was added to the reaction mixture, and the organic layer was separated, washed with saturated salt water and dried with magnesium sulfate. After solvent was distilled off, purification by column chromatography (silica gel/hexane plus 50% dichloromethane, dichloromethane, then finally dichloromethane plus 3% methanol) gave the light yellow amorphous solid (5.7 g, yield 67%).

Step 2—Synthesis of 2-(2-phenyl-2-propyl-9,10-bis (4-(2,2-diphenylvinyl)phenyl) anthracene (Compound 30)

Dissolved in acetic acid (50 ml) were 2-(2-phenyl-2-propyl)-9,10-bis(4-2,2-diphenylvinyl) phenyl)-9,10-dihydro-9, 10-dihydroxyanthracene (5.7 g, 6.7 mmole), potassium iodide (3.3 g, 20 mmole) and sodium phosphinate hydride (1.1 g, 10 mmole), and they were stirred at 100° C. The reaction mixture was diluted with water (50 ml) and extracted with toluene (300 ml). The organic layer was washed with saturated salt water (50 ml) and dried with magnesium sulfate. After solvent was distilled off, purification by column chromatography (silica gel/hexane plus 30% dichloromethane) gave the light yellow solid (4.5 g, 82%). This substance was identified as compound 31 by 1H-NMR and FD-MS measurements.

Example D

Synthesis of Compound 31

Step 1—Synthesis of "Compound 1"

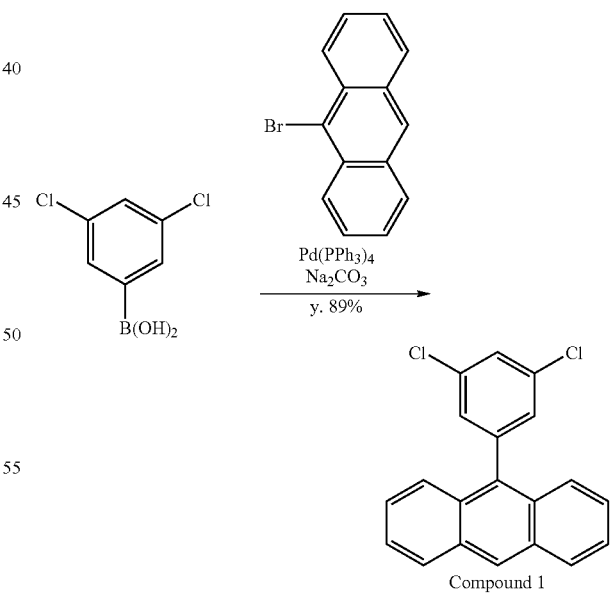

Placed in a three-necked flask were 3,5-dichlorobenzene-1-boric acid (3.0 g), 9-bromoanthracene (4.47 g) and Pd (PPh3)4 (0.54 g), and the atmosphere was displaced with argon. Added to them were toluene (20 ml) and an aqueous solution (2.4 ml) of sodium carbonate (5.02 g). They were heated and refluxed for 7 hrs. The reaction solution was extracted with toluene followed by concentrating under reduced pressure. The solid obtained was washed with ethanol to yield compound 1 (4.52 g, yield 89%). 1H-NMR (CDCl₃): δ (ppm) 8.51 (s, 1H), 8.2-8.0 (m, 2H), 7.8-7.0 (m, 9H).

Step 2—Synthesis of "Compound 2"

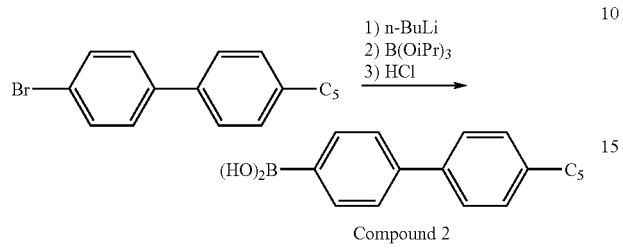

Compound 2

Added to a flask in which the atmosphere had been displaced with argon were 4-bromo-4'-n-pentylbiphenyl (5.0 g) and anhydrous ether (50 ml), and they were cooled to −20° C. A 1.6 M hexane solution (15.2 ml) of butyllithium was added dropwise gradually. After 30 min, they were heated to room temperature and stirred at room temperature for 1 hr. This reaction solution was added dropwise to anhydrous ether solution (80 ml) of triisopropyl borate (8.28 g) at −20° C. They were allowed to reach room temperature, and stirred overnight. After 2 N hydrochloric acid was added to the reaction solution and they were stirred for 1 hr, the organic layer was separated. After the organic layer was concentrated under reduced pressure, the solid obtained was subjected to silica gel column chromatography (for the eluant solvent, hexane/ethyl acetate=3/1, 2/1 and 0/1 were used in that order) to give compound 2 (1.77 g, yield 40%). 1H-NMR (CDCl₃): δ (ppm) 8.3 (d, 1H), 7.9-7.5 (m, 6H), 7.3 (m, 1H), 4.6 (s, 2H), 2.6 (t, 2H), 1.8-1.2 (t, 6H), 0.9 (t, 3H).

Step 3—Synthesis of "Compound 3"

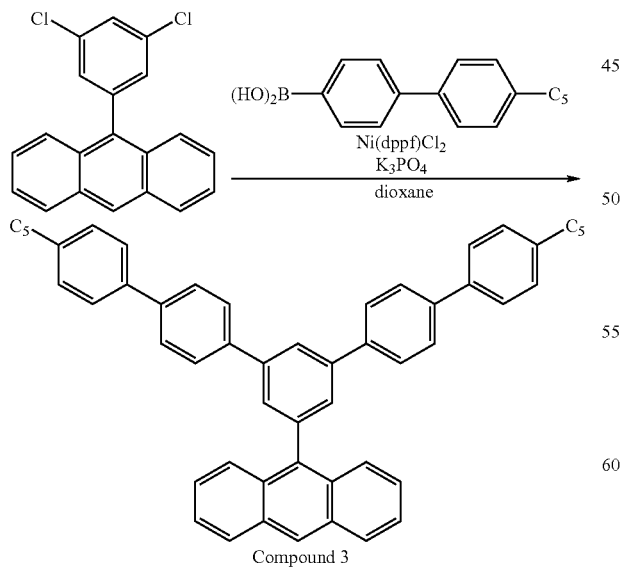

Compound 3

Compound 1 (0.75 g), compound 2 (1.50 g), Ni(dppf)Cl₂ (64 mg), potassium phosphate (2.84 g) and dioxane (20 ml) were added to a three-necked flask the atmosphere of which had been displaced with argon. They were heated and refluxed for 11 hrs. Water (100 ml) was added to the reaction solution to precipitate a solid. The solid was washed with ethanol. The solid obtained was subjected to purification by silica gel column chromatography (eluant solvent: hexane/methylene chloride=4/1) to yield compound 3 (0.80 g, yield 49%).

1H-NMR (CDCl₃): δ (ppm) 8.6 (s, 1H), 8.2-7.2 (m, 27H), 2.6 (t, 2H), 1.8-1.2 (m, 6H), 0.9 (t, 3H).

Step 4—Synthesis of "Compound 4"

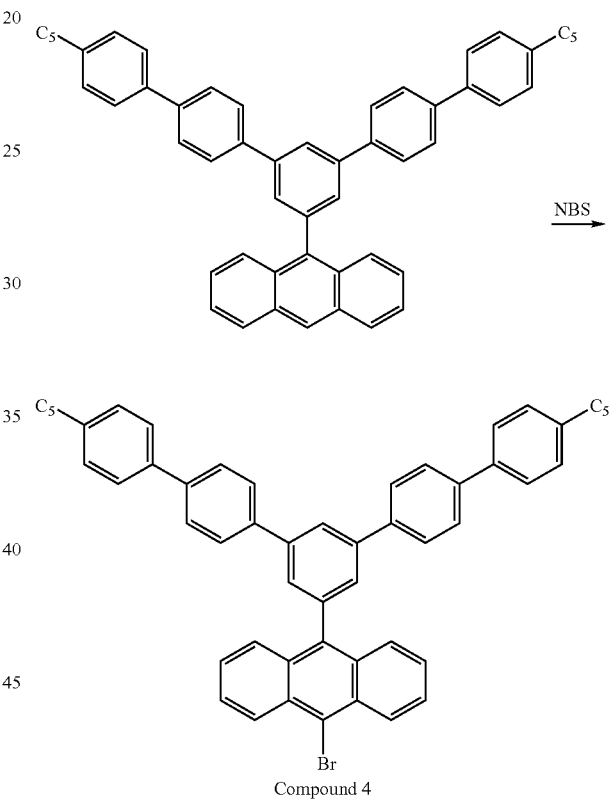

Compound 4

Compound 3 (0.80 g) was dissolved in N,N-dimethylformamide (20 ml), and N-bromosuccinimide (0.24 g) was added into it. The mixture was stirred at room temperature for 1 day. Water (100 ml) and methylene chloride (100 ml) were added to them to extract an organic layer, followed by washing with 1 N hydrochloric acid (50 ml×2 times).

The organic layer was concentrated under reduced pressure. The solid obtained was subjected to silica gel column chromatography (eluant solvent: hexane/methylene chloride=1/1) to yield compound 4 (0.98 g, yield 110%). Compound 4 contained some N-dimethylformamide. 1H-NMR (CDCl₃): δ (ppm) 8.6 (d, 1H), 8.2-7.2 (m, 27H), 2.7 (t, 2H), 118-1.2 (m, 6H), 0.9 (t, 3H).

Step 5—Synthesis of 9-(4-(2,2-diphenylvinyl)phenyl)-10-(3,5-bis(4-(4-pentylphenyl)phenylanthracene (Compound 31)

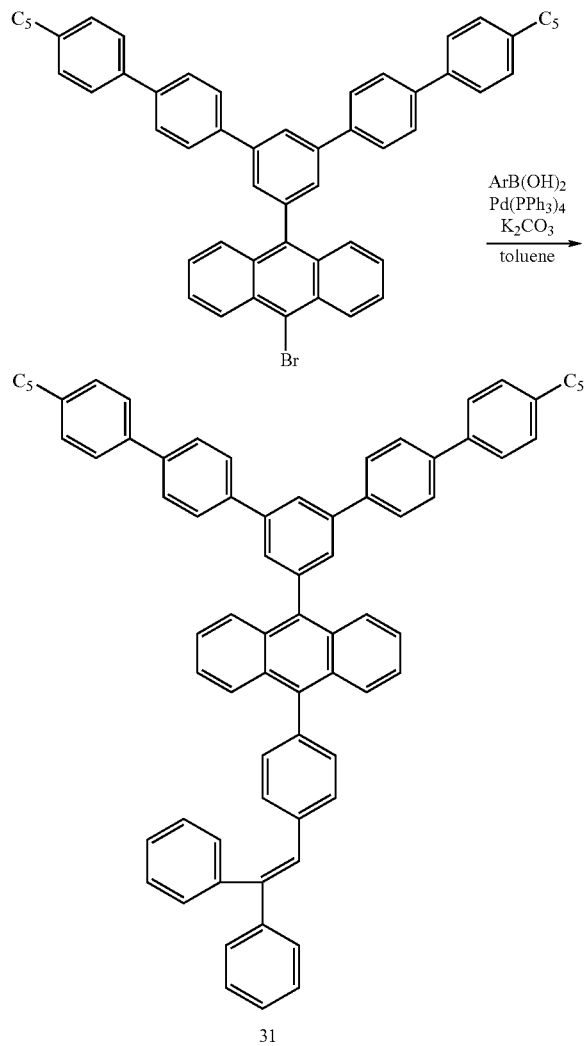

Compound 4 (0.98 g), 4-(2,2-diphenylethenyl) pehnylboric acid (0.41 g) and Pd (PPh$_3$)$_4$ (40 mg) were placed in a flask under the environment of argon. Added to them were toluene (10 ml) and an aqueous solution (1.7 ml) of sodium carbonate (0.37 g), and they were heated at 80° C. for 6.5 hrs. Water (100 ml) and methylene chloride (100 ml) were then added, and an organic layer was extracted. After concentrating under reduced pressure, the solid obtained was purified by silica gel column chromatography to give compound 31 (0.86 g, yield 78%). 1H-NMR (CDCl$_3$): δ (ppm) 8.0-7.2 (m, 39H), 2.6 (t, 2H), 1.8-1.2 (m, 6H), 0.9 (t, 3H).

Layer and Device Fabrication

The following examples, Examples E-H, illustrate fabrication of a high performance fluorescent blue or green OLED devices, which includes solution processing a hole injection, hole transport, and emitter layer. The device material components were as follows: (1) Substrate—indium-tin oxide; (2) Hole Injection Layer—hole injection material (PEDOT/colloid forming fluorinated polymeric acid (such as is commercially available from DuPont under the trademark Nafion®)); (3) Hole Transport Layer—a poly(triarylamine), specified below; (4) Emissive Layer—a mixture of a small molecule anthracene or styrylarylene host with small molecule styrylamine, naphthylamine, chrysylamine, pyrenylamine, or anthracenylamine dopant; (5) Electron Transport Layer—tris (8-quinolinolato)alumininum (Alq$_3$); and (6) Cathode—LiF and aluminum.

Example E

Fabrication of a Blue OLED Device

Patterned ITO substrates (device active area=0.25×0.25 cm) were cleaned. After cooling, an aqueous dispersion of hole injection material (above) was spin-coated over the ITO surface to form a buffer layer at a thickness of approx. 20 nm. The cathode leads were wiped clean with damp swabs and the substrates were then baked at 130° C. for 10 minutes in air. The dried substrates were then transferred to a nitrogen filled drybox, in which all further manipulations are conducted.

After cooling, the substrates were spin-coated with a 1% w/v solution of a polymer having monomeric units of Formula 41 in toluene to a nominal thickness of 20 nm to form a hole transport layer, and then baked again at 130° C. for 30 minutes at atmospheric pressure:

After cooling, the substrates were spin-coated with a 1% w/v toluene solution of a 13:1 host:dopant mixture to a thickness of 40-50 nm to form an emissive layer.

The cathode contacts were wiped clean, and the substrates were baked at 90° C. for 30 min at atmospheric pressure. After this time, the substrates were masked and placed in a vacuum chamber. After pumping to a base pressure of 2×10$^{-7}$ torr, a layer of Alq$_3$ (purchased from Sensient, singly sublimed grade) was deposited by thermal evaporation, to a thickness of 20 nm, to form the electron transport layer. This was followed by a layer of lithium fluoride (1 nm, purchased from Aldrich Chemical Co.), which defines the active area. The cathode mask was changed, and then an overcoat of Al (100 nm, purchased from Aldrich Chemical Co.) was vapor deposited, to form the cathode. The chamber was then vented to argon, and the devices were encapsulated using a glass lid and UV curable epoxy. These devices were then measured for initial current, voltage, luminance and color coordinate properties. Finally, the luminance degradation behavior was examined by subjecting the devices to constant current for a prolonged time period while monitoring luminance and voltage change. The resulting device performance data is listed in Table 1.

Example F

Fabrication of Another Blue OLED Device

This device was made according to the procedure outlined for Example E, except the hole transport layer comprised a crosslinkable poly(triarylamine) commercially available as HT-12 from Dow Chemical. This poly(triarylamine) was dissolved in toluene to 0.4% w/v and spin coated to a thickness of 20 nm. It was then baked at 200° C. for 30 min at atmospheric pressure to form the hole transport layer.

The emissive layer material solution was then applied as described in Example E. The resulting device performance data is listed in Table 1.

Example G

Fabrication of Another Blue OLED Device

This device was made according to the procedure described for Example F, except a 1:1 mixture of toluene and trifluorotoluene was used to dissolve the host and dopant (1.0% w/v).

This mixture was spin coated onto the hole transport layer film to a thickness of 40 nm. It was then baked at 120° C. in vacuo (<10$^{-2}$ torr) for 30 min, followed by application of the remaining device layers as described above for Examples E and F. The resulting device performance data is listed in Table 1.

Example H

Fabrication of a Green OLED Device

This device was made according to the procedure outlined for Example G, except an alternative green host:dopant material in a 30:1 ratio, were dissolved to 1.0% w/v in 1:1 trifluorotoluene/toluene.

The resulting device performance data is listed in Table 1.

TABLE 1

| Ex. | Color | Initial Efficiency (cd/A) @ 10 mA/cm² | Voltage @ 10 mA/cm² | Luminance (cd/m²) @ 10 mA/cm² | Color Coord. (CIE x, y) | Lum. Half-Life (hours) @ Initial Lum. (cd/m²) |
|---|---|---|---|---|---|---|
| E | Blue | 2.91 | 6.3 | 291 | (0.16, 0.19) | 80 @ 825 |
| F | Blue | 2.75 | 4.8 | 275 | (0.17, 0.17) | 1050 @ 945 |
| G | Deep Blue | 5.3 | 5.2 | 530 | (0.15, 0.15) | 315 @ 1430 |
| H | Green | 18.5 | 6.1 | 1850 | (0.32, 0.62) | 600 @ 4840 |

Example I

Table 2 provides a range of components for devices that could be made as described above, and that are believed to be substantially equivalent to the foregoing:

TABLE 2

| | Device 1 (Blue) | Device 2 (Blue) | Device 3 (Blue) | Device 4 (Green) |
|---|---|---|---|---|
| Hole transport layer material | Formula 41 | HT-12 | HT-12 | HT-12 |
| Distyrylarylene | Compound 10 | Compound 10 | Compound 10 | Compound 10 |
| Arylamine | Compound 38A | Compound 38A | Compound 38A | Compound 38 |
| Solvent | toluene | toluene | 1:1 toluene/trifluorotoluene | 1:1 toluene/trifluorotoluene |
| host:dopant ratio (w:w) | 13:1 | 13:1 | 13:1 | 30:1 |
| solute:solvent ratio (w:v) | 1.0% w/v | 1.0% w/v | 1.0% w/v | 1.0% w/v |

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Many aspects and embodiments have been described above and are merely exemplary and not limiting. After reading this specification, skilled artisans appreciate that other aspects and embodiments are possible without departing from the scope of the invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges include each and every value within that range.

The invention claimed is:

1. A composition comprising:
   (i) a distyrylarylene or mixtures of a distyrylarylene and a diarylantracene; and
   (ii) an arylamine;
   in a concentration of about 1.0% w/v in a solvent, wherein the weight:weight ratio of (i):(ii) is about 10:1 to about 40:1;

wherein said distyrylarylene is of the formula

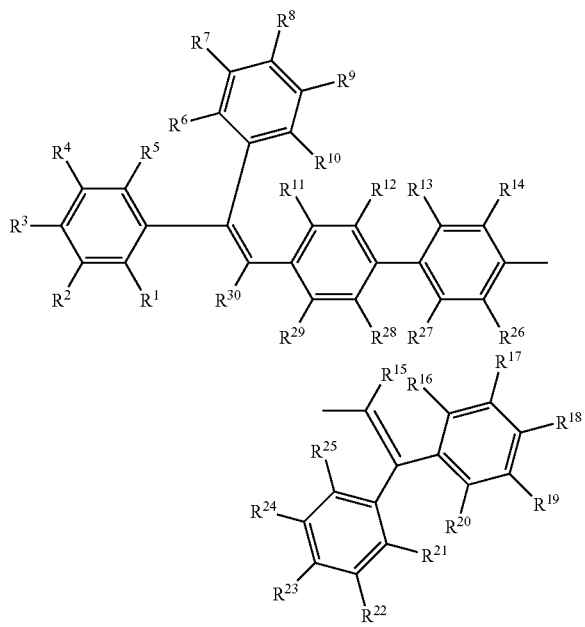

wherein R[1] to R[30] are, independently, hydrogen, alkyl, alkoxy, or aryl.

2. The composition of claim 1, wherein the weight ratio of distyrylarylene:arylamine is 13:1.

3. The composition of claim 1, wherein the weight ratio of distyrylarylene:arylamine is 30:1.

4. The composition of claim 1, wherein the solvent is an aromatic hydrocarbon.

5. The composition of claim 1, wherein the solvent is toluene, xylene, mesitylene, anisole, chlorobenzene, cyclohexanone, gamma-valerolactone, chloroform, tetrachloroethane, tetrachloroethylene, trifluorotoluene, methylbenzoate, N,N-dimethylformamide or derivatives thereof.

6. The composition of claim 1, wherein the solvent is toluene, xylene, mesitylene, anisole, chlorobenzene, cyclohexanone, gamma-valerolactone, or chloroform, or derivatives thereof, or mixtures thereof.

7. The composition of claim 1, wherein the solvent is toluene.

8. The composition of claim 7, wherein the solvent is trifluorotoluene.

9. The composition of claim 1, wherein the solvent is toluene and trifluorotoluene.

10. The composition of claim 9, wherein the toluene and trifluorotoluene are in a 1:1 volume:volume ratio.

11. The composition of claim 1, wherein the solvent further includes esters, ketones, and alcohols.

12. A composition comprising:
    a host and a dopant, wherein the weight:weight ratio of host:dopant is about 10:1 to about 40:1, wherein said host is a distyrylarylene or mixtures of a distyrylarylene and a diarylantracene; and
    a solvent;
wherein said distyrylarylene is of the formula

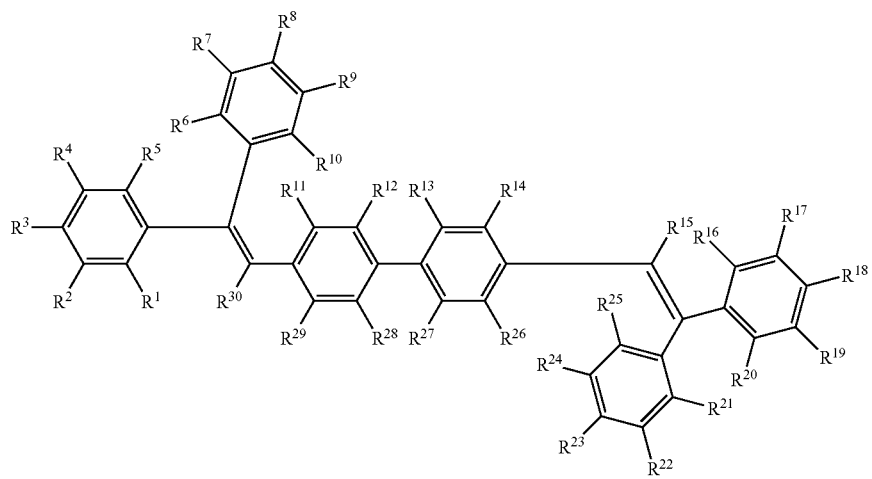

wherein R[1] to R[30] are, independently, hydrogen, alkyl, alkoxy, or aryl.

13. The composition of claim 12, wherein the solvent is organic and nonreactive with the host and dopant.

14. The composition of claim 12, wherein the host and dopant are present in a concentration of about 1.0% w/v in the solvent.

15. The composition of claim 12, wherein the weight ratio of host:dopant is about 13:1.

16. A method for forming an organic electronic device, comprising:
    providing the composition of claim 12; and
    depositing the composition as a liquid.

17. The method of claim 16, wherein the depositing step is spin-coating.

18. A composition including the composition of claim 12.

19. An organic electronic device having an active layer including the composition of claim 12.

20. An article useful in the manufacture of an organic electronic device, comprising the composition of claim 12.

21. A composition comprising:
   (i) a distyrylarylene, a diarylanthracene, or mixtures thereof; and
   (ii) an arylamine;
   in a concentration of about 1.0% w/v in a solvent, wherein the weight:weight ratio of (i):(ii) is about 10:1 to about 40:1, wherein the solvent comprises trifluorotoluene.

22. The composition of claim 21 wherein said solvent additionally comprises toluene.

23. The composition of claim 22, wherein the toluene and trifluorotoluene are in a 1:1 volume:volume ratio.

24. The composition of claim 21, wherein the weight ratio of distyrylarylene:arylamine is 13:1.

25. The composition of claim 21, wherein the weight ratio of distyrylarylene:arylamine is 30:1.

* * * * *